US008569930B2

(12) United States Patent
Takahashi et al.

(10) Patent No.: US 8,569,930 B2
(45) Date of Patent: Oct. 29, 2013

(54) PIEZOELECTRIC ACTUATOR AND AUDIO COMPONENTS

(75) Inventors: Masatake Takahashi, Minato-ku (JP); Yasuhiro Sasaki, Minato-ku (JP); Yasuharu Onishi, Minato-ku (JP); Yukio Murata, Minato-ku (JP); Ukyo Mori, Minato-ku (JP); Jun Kuroda, Minato-ku (JP)

(73) Assignee: NEC Corporation, Tokyo (JP)

( * ) Notice: Subject to any disclaimer, the term of this patent is extended or adjusted under 35 U.S.C. 154(b) by 88 days.

(21) Appl. No.: 13/319,872

(22) PCT Filed: Apr. 12, 2010

(86) PCT No.: PCT/JP2010/056501
§ 371 (c)(1),
(2), (4) Date: Jan. 31, 2012

(87) PCT Pub. No.: WO2010/131540
PCT Pub. Date: Nov. 18, 2010

(65) Prior Publication Data
US 2012/0119617 A1    May 17, 2012

(30) Foreign Application Priority Data
May 11, 2009  (JP) .................................. 2009-114575

(51) Int. Cl.
*H01L 41/08* (2006.01)
(52) U.S. Cl.
USPC ............................................ 310/324; 31/331
(58) Field of Classification Search
USPC ......................................... 310/324, 330–332
See application file for complete search history.

(56) References Cited

U.S. PATENT DOCUMENTS

| 4,734,611 A | * | 3/1988 | Granz ........................... 310/324 |
| 5,196,755 A | * | 3/1993 | Shields ........................ 310/324 |
| 6,232,702 B1 | * | 5/2001 | Newnham et al. ........... 310/334 |
| 7,259,499 B2 | * | 8/2007 | Askew et al. ................. 310/328 |
| 2010/0038998 A1 | | 2/2010 | Onishi et al. |

FOREIGN PATENT DOCUMENTS

| JP | 61-168971 A | 7/1986 |
| JP | 10-108297 A | 4/1998 |
| JP | 2000-140759 A | 5/2000 |
| JP | 2001-017917 A | 1/2001 |
| JP | 2001-339791 A | 12/2001 |
| JP | 2005-123757 A | 5/2005 |
| WO | 2005/067346 A1 | 7/2005 |
| WO | 2008/084806 A1 | 7/2008 |

* cited by examiner

*Primary Examiner* — Mark Budd
(74) *Attorney, Agent, or Firm* — Sughrue Mion, PLLC

(57) ABSTRACT

One object of the present invention is to an achieve increase of amplitude of vibrations and/or flattening of frequency dependence of the amplitude of a piezoelectric actuator. Piezoelectric actuator (100) has first piezoelectric vibrator (102), second piezoelectric vibrator (104), and vibrating membrane (106). First piezoelectric vibrator (102) includes first pedestal (116) and first piezoelectric element (112) connected to the first pedestal. Second piezoelectric vibrator (104) includes second pedestal (118) and second piezoelectric element (114) connected to the second pedestal. Vibrating membrane (106) has opening (108). First piezoelectric vibrator (102) is connected to one surface of vibrating membrane (106) straddling opening (108) of the vibrating membrane. Second piezoelectric vibrator (102) is connected to another surface of vibrating membrane (106) straddling opening (108) of the vibrating membrane.

17 Claims, 27 Drawing Sheets

PIEZOELECTRIC ACTUATOR AND AUDIO COMPONENTS

CROSS REFERENCE TO RELATED APPLICATIONS

This application is a National Stage of International Application No. PCT/JP2010/056501, filed on Apr. 12, 2010, which claims priority from Japanese Patent Application No. 2009-114575, filed May 11, 2009, the contents of all of which are incorporated herein by reference in their entirety.

TECHNICAL FIELD

The present invention relates to a piezoelectric actuator including two piezoelectric vibrators, and audio components.

BACKGROUND ART

In recent years, there has been desired a smaller and more power-saving actuator than an electromagnetic actuator, and a piezoelectric actuator including a piezoelectric element as a vibration source has been being developed. The piezoelectric actuator generates mechanical vibrations by movement of the piezoelectric element. The piezoelectric actuator can be utilized as an audio component, such as a vibrator used for a mobile device, and a loudspeaker.

However, there is a problem that rigidity of the piezoelectric element is generally high, and that amplitude of vibrations of the piezoelectric actuator is smaller than amplitude of vibrations of the electromagnetic actuator. In order to solve this problem, a technology for increasing the amplitude of the vibrations of the piezoelectric actuator has been disclosed in the following Patent Literatures 1 to 5.

Patent Literature 2 discloses a piezoelectric actuator including a vibrating body (pedestal) formed by connecting an elastic body and a piezoelectric element. In this piezoelectric actuator, a periphery of the elastic body is supported by a spring structure having a resonance frequency close to a resonance frequency of the piezoelectric element. In a piezoelectric actuator described in Patent Literature 3, a slit is formed in an elastic body (pedestal) to which a piezoelectric element is connected, and as a result, amplitude of vibrations of the elastic body is amplified.

In Patent Literature 4, an audio device including a piezoelectric actuator has been disclosed. In this piezoelectric actuator, the periphery of a piezoelectric vibrator formed by connecting a piezoelectric element and a vibrating diaphragm (pedestal) is fixed to an inner periphery of a ring-shaped support member. Additionally, an outer periphery of the support member is fixed to a case. A portion between the inner periphery and the outer periphery of the support member is curved. The piezoelectric actuator can vibrate in a direction vertical to a plate surface of the vibrating diaphragm, and in a direction parallel to the plate surface of the vibrating diaphragm by connecting the pedestal to the case through the curved support member.

In a piezoelectric actuator described in Patent Literature 5, a piezoelectric element is connected to both surfaces of one restraining member (pedestal). The piezoelectric element is restrained by the restraining member. A plurality of beam members are formed on an outer periphery of the restraining member, and these beam members are fixed to a support member.

Incidentally, a piezoelectric vibrator of a piezoelectric actuator is classified into a bimorph type vibrator in which a piezoelectric element is connected to both surfaces of one pedestal, and a unimorph type vibrator in which the piezoelectric element is connected only to the one surface of the one pedestal. In Patent Literatures 1, 2, 4, and 5, the bimorph type piezoelectric vibrator has been disclosed. Generally, the bimorph type piezoelectric vibrator has a higher drive force and a larger amplitude of vibrations than the unimorph type piezoelectric vibrator.

FIG. 1 is a schematic exploded perspective view of a typical bimorph type piezoelectric actuator. Piezoelectric actuator 3200 has piezoelectric element 3212 comprised of piezoelectric ceramics, pedestal 3216 to which piezoelectric element 3212 is connected, and frame-shaped support body 3210 that supports pedestal 3216. Pedestal 3216 is plate-shaped, and an outer periphery of the pedestal is supported by support body 3210.

FIG. 2 is a schematic view schematically showing a condition of vibrations of piezoelectric actuator 3200. When an AC (alternating-current) voltage is applied to piezoelectric element 3212, it performs expansion and contraction movement. Since piezoelectric element 3212 is connected to pedestal 3216, pedestal 3216 bends in direction R vertical to a principal surface thereof according to the expansion and contraction movement of piezoelectric element 3212 as shown in FIG. 2. In a manner described above, pedestal 3216 vibrates in direction R vertical to the plate surface of the pedestal in a state where a connection portion with support body 3210 is set as a fixed end and a center of pedestal 3216 is set as a belly.

It is assumed that the piezoelectric actuators described in Patent Literatures 1 to 3 are mainly utilized as vibrators. Namely, in the piezoelectric actuators described in Patent Literatures 1 to 3, there is no intent to improve characteristics as audio components.

In the case where the piezoelectric actuator is used as the vibrator, the amplitude of vibrations of the piezoelectric actuator may be large only in a specific frequency. However, in a case of using the piezoelectric actuator as an audio component, frequency characteristics of the piezoelectric actuator are important. It is desirable for the audio component not only to have a high sound pressure level, but also to have flat frequency dependence of the sound pressure level in order to faithfully reproduce the original sound. It is desirable that the frequency dependence of the sound pressure level is flattened in an audible region, particularly in a frequency band of 100 Hz to 10 kHz.

In an audio component including a piezoelectric vibrator, the bimorph type piezoelectric vibrator is widely used in order to secure a drive force of the piezoelectric vibrator and to improve the sound pressure level. However, the bimorph type piezoelectric vibrator has higher rigidity than the unimorph type piezoelectric vibrator, and as a result of it, a frequency of amplitude of vibrations of the piezoelectric actuator is extremely changed near a resonance frequency.

In the piezoelectric actuator described in Patent Literature 4, since the piezoelectric vibrator is not strongly fixed to the case, the frequency change of the amplitude of the vibrations of the piezoelectric actuator is flattened. However, since energy is used for vibrations in a radial direction of the vibrating diaphragm in the vibrating diaphragm of the piezoelectric actuator, the amplitude of vibrations in a thickness direction of the vibrating diaphragm becomes low. Hence, there is a problem that the sound pressure level is lowered when this piezoelectric actuator is utilized as the audio component.

The invention in Patent Literature 5 aims at providing a piezoelectric actuator in which amplitude of vibrations is large and in which the resonance frequency can be adjusted while avoiding increase of an outside dimension. However, it is desirable to improve the sound pressure level in a low frequency band and to flatten frequency characteristics of vibration amplitude for the purpose of higher performance.

In addition, when the piezoelectric actuator is utilized as the audio component, further improvement of the piezoelectric actuator is desired in order to achieve improvement of the sound pressure level and flattening of the frequency characteristics of the sound pressure level as described above.

What is desired, in addition, is a piezoelectric actuator in which the vibration characteristics are easy to adjust and in which there is a high degree of design freedom so that a piezoelectric actual can be provided that has various applications, such as being used as a vibrator, rather than having only an application as an audio component.

CITATION LIST

Patent Literature

Patent Literature 1: JP61-168971A
Patent Literature 2: JP2000-140759A
Patent Literature 3: JP2001-17917A
Patent Literature 4: JP2001-339791A
Patent Literature 5: WO2008/084806

SUMMARY

An object of the present invention is to provide a piezoelectric actuator and an audio component with which at least one of the above-described problems in Background Art can be solved. One example of the object is to achieve an increase of amplitude of vibrations and/or flattening of frequency dependence of the vibration amplitude.

A piezoelectric actuator in one aspect of the present invention has a first piezoelectric vibrator, a second piezoelectric vibrator, and a vibrating membrane. The first piezoelectric vibrator includes a first pedestal and a first piezoelectric element connected to the first pedestal.

The second piezoelectric vibrator includes a second pedestal and a second piezoelectric element connected to the second pedestal. The vibrating membrane has an opening. The first piezoelectric vibrator is connected to one surface of the vibrating membrane straddling the opening of the vibrating membrane. The second piezoelectric vibrator is connected to another surface of the vibrating membrane straddling the opening of the vibrating membrane.

In addition, an audio component in one aspect of the present invention has the above-described piezoelectric actuator, and emits sound by bending vibration of the piezoelectric actuator.

According to the present invention, an increase of the amplitude of the vibrations of the piezoelectric actuator and flattening of the frequency dependence of the amplitude of the vibrations can be achieved.

The above-described and other objects, features, and advantages of the present invention will be apparent from the following description exemplifying the present invention with reference to accompanying drawings.

DESCRIPTION OF EMBODIMENTS

Hereinafter, exemplary embodiments will be described with reference to drawings. A piezoelectric actuator of the present invention can be utilized suitably, for example, for a vibrator, an audio component, etc.

Figure 3:
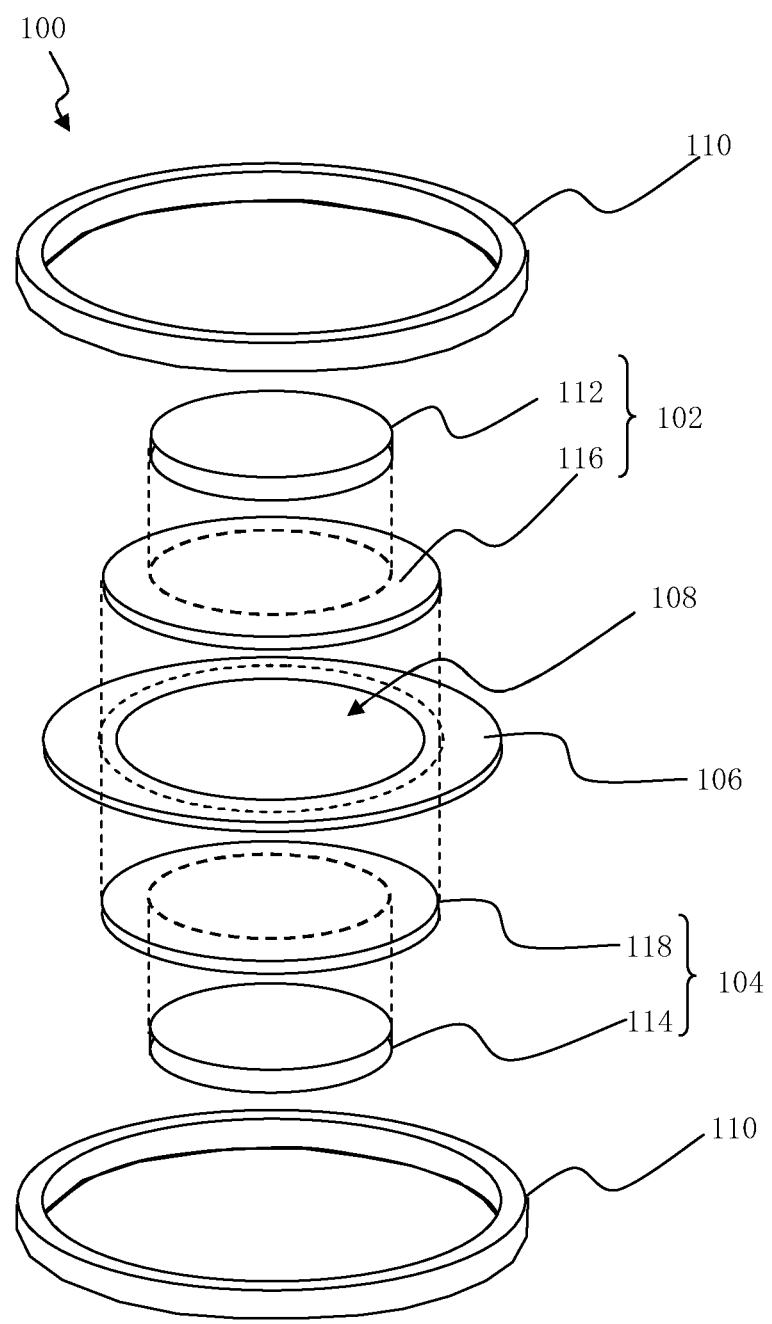
FIG. 3 is a schematic exploded perspective view of a piezoelectric actuator according to an exemplary embodiment 1.
Figure 4:
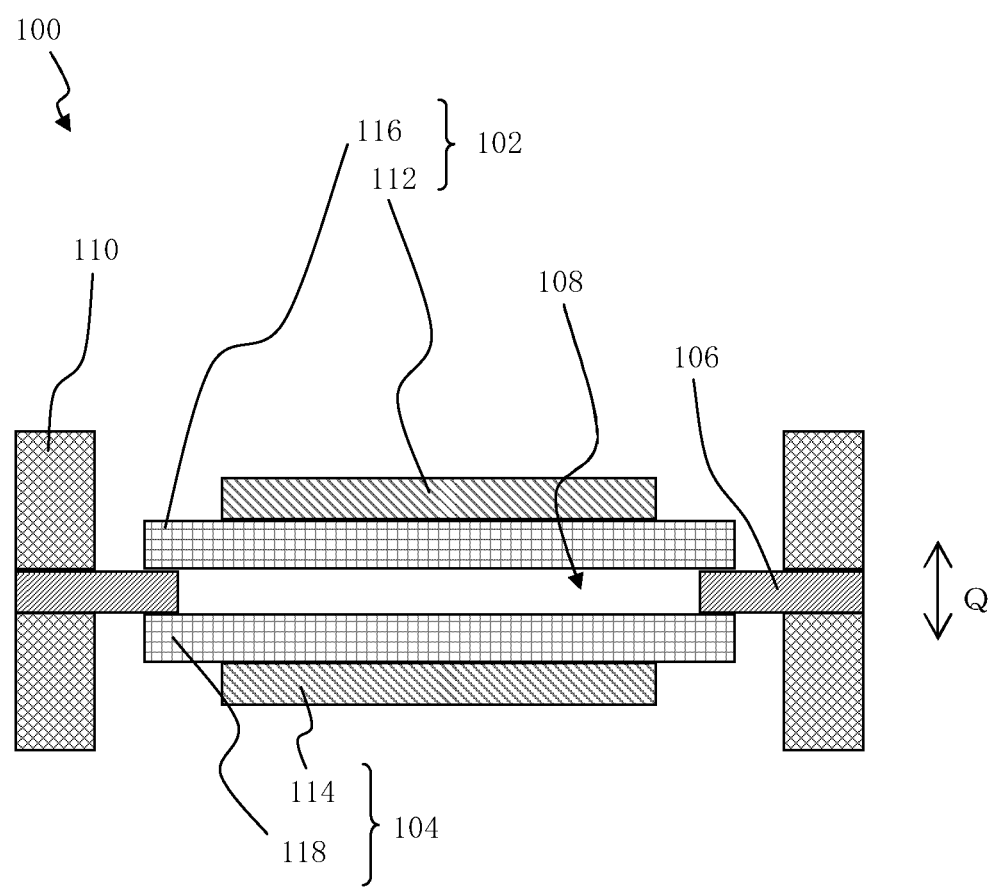
FIG. 4 is a schematic cross-sectional view of the piezoelectric actuator according to the exemplary embodiment 1.

FIG. 3 is a schematic exploded perspective view of a piezoelectric actuator according to a first exemplary embodiment, and FIG. 4 is a schematic cross-sectional view of this piezoelectric actuator.

Piezoelectric actuator 100 has first piezoelectric vibrator 102, second piezoelectric vibrator 104, vibrating membrane 106, and support body 110 that supports vibrating membrane 106. First piezoelectric vibrator 102 includes first pedestal 116 and first piezoelectric element 112 connected to first pedestal 116. Second piezoelectric vibrator 104 includes second pedestal 118 and second piezoelectric element 114 connected to second pedestal 118. First and second piezoelectric elements 112 and 114 function as vibration sources of piezoelectric vibrators 102 and 104.

First pedestal 116 of first piezoelectric vibrator 102 is connected to one surface of vibrating membrane 106 straddling opening 108 of vibrating membrane 106. Second pedestal 118 of second piezoelectric vibrator 104 is connected to another surface of vibrating membrane 106 straddling opening 108 of vibrating membrane 106. It is to be noted that in the exemplary embodiment, first and second piezoelectric elements 112 and 114 connected to first and second pedestals 116 and 118 are directed to an opposite side of vibrating membrane 106.

First piezoelectric vibrator 102 and second piezoelectric vibrator 104 are not directly connected to each other, and they are opposite to each other through vibrating membrane 106. Since first and second piezoelectric vibrators 102 and 104 straddle opening 108 of vibrating membrane 106, the force that restrains both the first piezoelectric vibrator and the second piezoelectric vibrator is weak. Hence, compared with a bimorph type piezoelectric actuator (Refer to FIG. 1.) in which the piezoelectric vibrator is connected to both surfaces of one pedestal, the mechanical restraining force of first piezoelectric vibrator 102 and second piezoelectric vibrator 104 is suppressed, and rigidity of the entire structure of the piezoelectric actuator is lowered. As a result, amplitude of vibrations of the piezoelectric actuator is improved, and frequency dependence of the vibration amplitude can be flattened.

Figure 1:
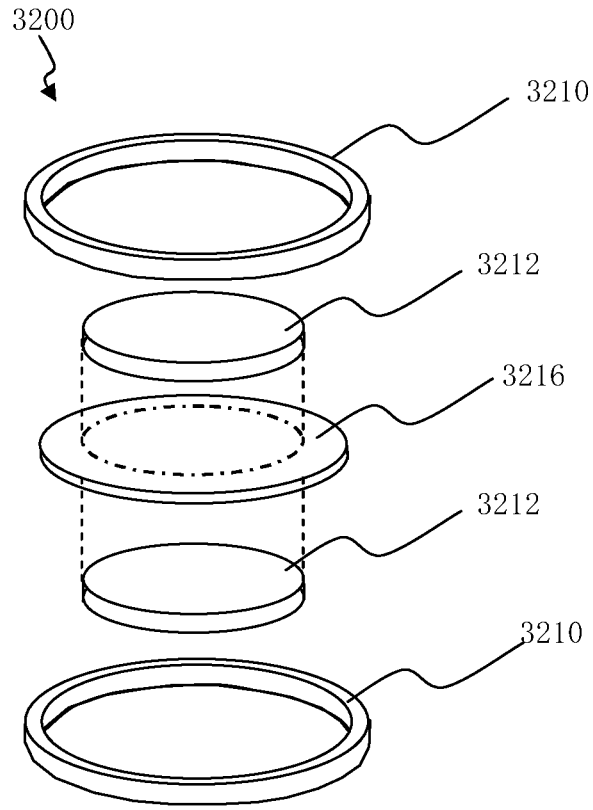
FIG. 1 is a schematic exploded perspective view of a piezoelectric actuator as a comparative example in relation to the present invention.
Figure 2:
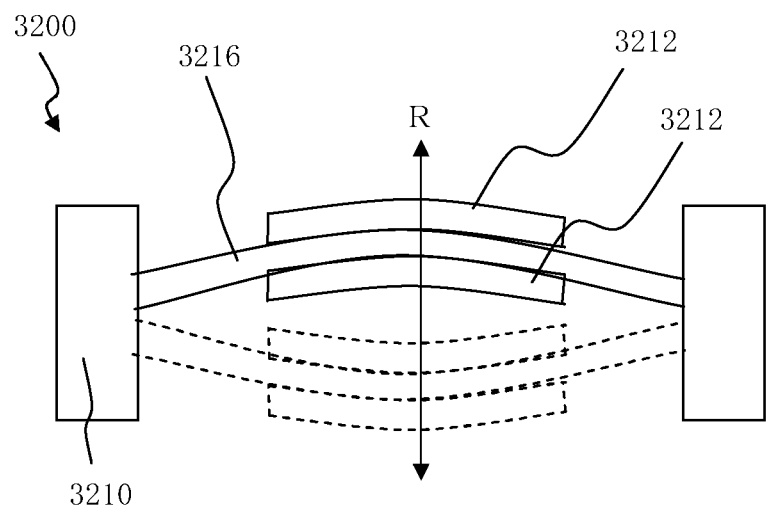
FIG. 2 is a schematic view for illustrating a condition of vibrations of the piezoelectric actuator of FIG. 1.

Hereinafter, the bimorph type piezoelectric actuator in which the piezoelectric vibrator is connected to the both surfaces of the one pedestal shown in FIG. 1 is referred to as a piezoelectric actuator of a comparative example.

It is preferable that the rigidity of vibrating membrane 106 is lower than the rigidity of first pedestal 116 and second pedestal 118. As a result, vibrating membrane 106 has a function to further increase the amplitude of vibrations of piezoelectric actuator 100. Further, when the rigidity of vibrating membrane 106 is low, vibrations of piezoelectric vibrators 102 and 104 are efficiently transmitted to vibrating membrane 106 in a wide frequency range. As a result, the level of the amplitude of the vibrations also increases in a frequency band near the resonance frequency, and as a result, the frequency change of the amplitude of the vibrations of piezoelectric actuator 100 is flattened.

Further, since two piezoelectric vibrators 102 and 104 are connected to one vibrating membrane 106, a large drive force is supplied to vibrating membrane 106. Consequently, the piezoelectric actuator of the exemplary embodiment can obtain sufficiently large amplitude in the wide frequency band.

The diameter of opening 108 of vibrating membrane 106 is smaller than the diameter of pedestals 116 and 118 in order to connect vibrating membrane 106 and pedestals 116 and 118. In addition, it is preferable that the size of opening 108 of vibrating membrane 106 is not less than half the size of pedestals 116 and 118 in order to decrease the size of the area of a region in which pedestals 116 and 118 and vibrating membrane 106 are directly connected to each other. As a result, the mechanical restraining force between first piezoelectric vibrator 102 and second piezoelectric vibrator 104 can be further lowered.

In exemplary embodiment 1, piezoelectric elements 102 and 104 and pedestals 116 and 118 are disc-shaped. Vibrating membrane 106 is a circular membrane and circular opening 108 is formed in a center thereof. Piezoelectric elements 112 and 114, pedestals 116 and 118, and vibrating membrane 106 are arranged in a concentric pattern, making centers thereof correspond to each other. An outer periphery of vibrating membrane 106 is connected to and supported by support body 110 formed as a circular frame shape. In the exemplary embodiment, the outer periphery of vibrating membrane 106 is sandwiched by two frame-shaped support bodies 110, and thereby vibrating membrane 106 is supported by support body 110.

Next, one example of a configuration of piezoelectric elements 112 and 114 will be described with reference to FIG. 5. Piezoelectric elements 112 and 114 are comprised of plate-shaped piezoelectric body 130 and electrode layer 132 formed on both surfaces of piezoelectric body 130. Power supply 136 that applies an AC voltage is electrically coupled with electrode layer 132, and thereby an AC electric field is applied to piezoelectric body 130. Piezoelectric body 130 has a property of deformation (expansion and contraction, and shear) when the electric field is applied.

There is no particular limitation on the material that may be used for piezoelectric body 130 and the material may be ceramics, such as lead zirconate titanate ceramics and barium titanate ceramics, or a polymeric material, such as polyvinylidene fluoride. It is preferable that piezoelectric body 130 be comprised of lead zirconate titanate ceramics that have high energy conversion efficiency from among the above-described materials.

Although there is not particular limitation to the shape of piezoelectric elements 112 and 114, it is preferable that piezoelectric elements 112 and 114 be plate-shaped with a thickness of not less than 20 μm and not more than 200 μm. It is preferable that the area of piezoelectric elements 112 and 114 be not more than the area of pedestals 116 and 118 in the connecting surface between piezoelectric elements 112 and 114, and pedestals 116 and 118 so that the entire one surface of piezoelectric elements 112 and 114 is connected to the pedestal.

Although there is not particular limitation to polarization direction P of piezoelectric body 130, in the exemplary embodiment polarization direction P is the thickness direction of plate-shaped piezoelectric body 130. When AC voltage is applied to electrode layer 132, the AC electric field is applied to piezoelectric elements 112 and 114. When piezoelectric elements 112 and 114 are not connected to pedestals 116 and 118, piezoelectric elements 112 and 114 repeat expansion and contraction in a radial direction due to the AC electric field. In other words, piezoelectric elements 112 and 114 repeat a first deformation mode in which principal surface is expanded, and a second deformation mode in which the principal surface is contracted.

Pedestals 116 and 118 are comprised of a plate-shaped elastic body that is hardly deformed even though the electric field is applied. Accordingly, pedestals 116 and 118 restrain piezoelectric elements 112 and 114. As a result, expansion and contraction of piezoelectric elements 112 and 114 is converted to a bending (deformation) action of direction Q vertical to the plate surface of plate-shaped piezoelectric elements 112 and 114. Namely, when the electric field is applied, piezoelectric vibrators 102 and 104 bend in direction Q vertical to the plate surface (Also refer to FIG. 4.) due to the difference of the deformation amount between piezoelectric elements 112 and 114, and pedestals 116 and 118. Accordingly, the AC electric field is applied to piezoelectric body 130, and thereby piezoelectric vibrators 102 and 104 vibrate in direction Q perpendicular to a membrane surface of vibrating membrane 106.

Figure 5:
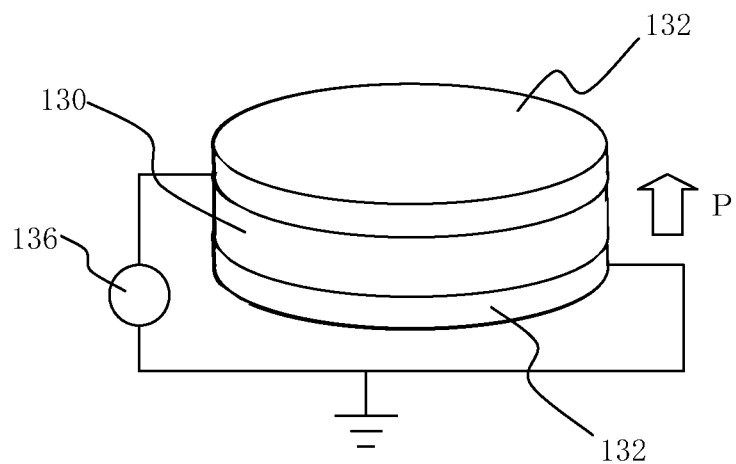
FIG. 5 is a schematic view showing one example of a piezoelectric element of a piezoelectric actuator.
Figure 6:
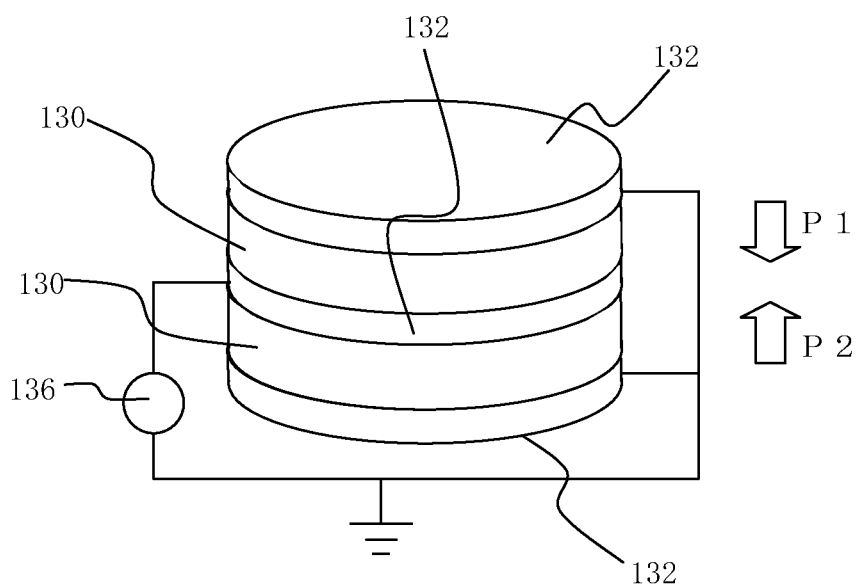
FIG. 6 is a schematic view showing another example of the piezoelectric element of the piezoelectric actuator.

The piezoelectric element is limited to the configuration shown in FIG. 5, but may have any configuration. For example, the piezoelectric element may be the element formed by piezoelectric body 130 and electrode layer 132 being stacked alternately as shown in FIG. 6. In this case, it is preferable that polarization directions P1 and P2 of piezoelectric bodies 130 that are adjacent to each other be configured so as to be opposite to each other.

First piezoelectric element 102 and second piezoelectric element 104 may have the same configuration, or may have different configurations. Piezoelectric elements 112 and 114 and pedestals 116 and 118 are disc-shaped in the exemplary embodiment. Although support body 110 has a circular frame shape in FIG. 3, there is no particular limitation to the shape of the support body, and it may be, for example, a square, a rectangle, or an oval frame shape.

The material that makes up pedestals 116 and 118 is selected from metal materials or resin materials, etc. according to desired rigidity. As metal materials, for example, aluminum alloy, copper alloy, iron, iron alloy, titanium, or titanium alloy are used. As resin materials, for example, epoxy, acrylics, polyimide, polycarbonate, polyethylene, polyethylene terephthalate, or urethane are used.

It is to be noted that as a connecting material for connecting each component member of piezoelectric actuator 100, for example, epoxy adhesive can be utilized. There is no particular limitation to the thickness of the adhesive layer. However, when the adhesive layer is excessively thick, the rigidity of piezoelectric actuator 100 and the amount of vibration energy that is absorbed by the adhesive layer are increased, and thereby the amplitude of vibrations may be lowered. Therefore, it is preferable that the thickness of the adhesive layer be, for example, not more than 20 µm.

The material that makes up vibrating membrane 106 may be a resin material or a metal material. As the resin material used for vibrating membrane 106, there are included, for example, epoxy, acrylics, polyimide, polycarbonate, polyethylene, polyethylene terephthalate, or urethane. As the metal material used for vibrating membrane 106, there are included, for example, aluminum alloy, copper alloy, iron, iron alloy, titanium, or titanium alloy.

Various combinations can be considered as a combination of the materials of pedestals 116 and 118, and the material of vibrating membrane 106. For example, pedestals 116 and 118 may be comprised of the metal material and vibrating membrane 106 may be comprised of the resin material, and both pedestals 116 and 118, and vibrating membrane 106 may be comprised of the resin material or the metal material. Alternatively, pedestals 116 and 118, and vibrating membrane 106 may be comprised of the same material, and the membrane thickness of vibrating membrane 106 may be thinner than the membrane thickness of pedestals 116 and 118. In this case, the rigidity of vibrating membrane 106 can become lower than the rigidity of pedestals 116 and 118.

When vibrating membrane 106 is comprised of the resin material, it is preferable that the thickness of vibrating membrane 106 be, for example, not less than 5 µm and not more than 500 µm. In particular, when vibrating membrane 106 is flat sheet-shaped, it is preferable that the thickness of vibrating membrane 106 be not less than 15 µm and not more than 180 µm.

In a case of the piezoelectric actuator of the comparative example (Refer to FIG. 1), two piezoelectric elements 3212 mechanically restrain each other through the pedestal. Therefore, usually, two piezoelectric elements 3212 are driven by the same voltage. However, since the force that is used to restrain first piezoelectric vibrator 102 and second piezoelectric vibrator 104 in the exemplary embodiment is weak, amplitude, frequencies, etc. of the AC voltage applied to first piezoelectric element 112 and of the AC voltage applied to second piezoelectric element 114 may be different from each other. Adjustment of the AC voltage is suitably selected according to applications of piezoelectric actuator 100.

Figure 7:
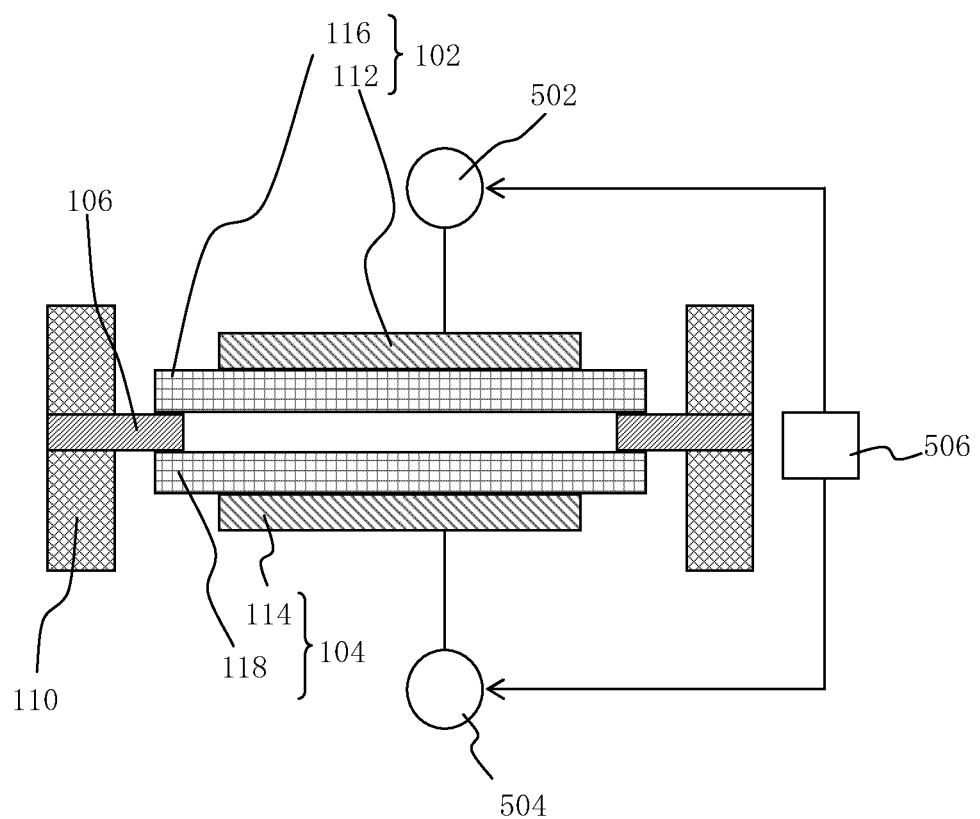
FIG. 7 is a schematic view showing one configuration for independently controlling a first piezoelectric vibrator and a second piezoelectric vibrator.

FIG. 7 is a schematic view of a piezoelectric actuator configured such that first piezoelectric vibrator 102 and second piezoelectric vibrator 104 can be controlled independently. This piezoelectric actuator includes first power supply 502 as a first driving device that drives first piezoelectric vibrator 102, and second power supply 504 as a second driving device that drives second piezoelectric vibrator 104. As a result, first piezoelectric vibrator 102 and second piezoelectric vibrator 104 can be driven independently, and a piezoelectric actuator having complex vibration characteristics can also be provided.

As described above, a piezoelectric actuator having a high degree of design freedom can be provided by independently driving two piezoelectric vibrators. In addition, it is preferable that the piezoelectric actuator further has control means 506 that independently controls voltages of first power supply 502 and second power supply 504, for example, a CPU according to desired characteristics.

By the way, when ceramics, which is a brittle material, is used as a piezoelectric body, a piezoelectric element may be damaged due to impact, such as by being dropped. Since a user may often drop a mobile electronic device by accident at the time of use, it is considered that a piezoelectric actuator that uses ceramic material is not suitable for mobile electronic devices.

In the piezoelectric actuator of the exemplary embodiment, first and second pedestals 116 and 118 are supported by support body 110 through vibrating membrane 106 having lower rigidity than these pedestals 116 and 118. Therefore, even if impact is given to piezoelectric actuator 100, the probability of damage to piezoelectric elements 112 and 114 is reduced since the force of the impact is absorbed by vibrating membrane 106. Accordingly, piezoelectric actuator 100 of the exemplary embodiment can also be suitably utilized for mobile electronic devices.

Piezoelectric actuator 100 according to the above-described exemplary embodiment can also be suitably utilized as an audio component mounted on electronic devices, such as a mobile phone, a notebook personal computer, and a small game machine.

When a piezoelectric actuator is utilized as an audio component that emits sound, conventionally, an organic film etc. is connected to the portion at which the piezoelectric actuator generally bends and vibrates, such as a pedestal. This organic film functions as a surface that radiates sound.

In the piezoelectric actuator according to the exemplary embodiment, vibrating membrane 106 can be made to function as a surface that radiates sound. Namely, in piezoelectric actuator 100 of the exemplary embodiment, vibrating membrane 106 has both a function to increase the amplitude of vibrations of piezoelectric actuator 100 and a function as a surface to radiate the sound of the audio component. As a result, it is not necessary to install another film in order to generate sound, thus enabling a reduction of the size of the audio component.

Next, frequency characteristics of a piezoelectric actuator will be described. Generally, it is considered difficult to emit a sufficiently large sound pressure level in a frequency band smaller than a basic resonance frequency in an audio component using a piezoelectric body as a drive source. Therefore, the audio component can often only generate only sound of a frequency band larger than the basic resonance frequency. For example, when the basic resonance frequency of the piezoelectric actuator is 2 kHz, it is difficult for an audio component that utilizes the piezoelectric actuator to generate sound of a frequency band smaller than 2 kHz.

The audio component needs to emit sound of a frequency band of 1 kHz to 10 kHz in order to reproduce music in a mobile device, such as a mobile phone. Accordingly, if the basic resonance frequency of the piezoelectric actuator is around 1 kHz, the piezoelectric actuator is used suitably for the mobile device. Further, an actuator that also has the advantage of enabling a reduction in size and thickness is useful for mobile devices.

However, since piezoelectric element 3212 is connected to both surfaces of one pedestal 3216 in the piezoelectric actuator of the comparative example, and further, pedestal 3216 is directly connected to support body 3210, the rigidity of the entire structure of piezoelectric actuator 3200 is high. As a result, the basic resonance frequency of piezoelectric actuator 3200 becomes high, and thus it is difficult to generate the sound that has the low frequency.

The piezoelectric actuator of the exemplary embodiment is more suitable than the piezoelectric actuator of the comparative example since sufficiently large amplitude of vibrations can be obtained in a wide frequency band.

A resonance frequency of first piezoelectric vibrator 102 and a resonance frequency of second piezoelectric vibrator 104 may be substantially the same as each other. In this case, when first and second piezoelectric vibrators 102 and 104 vibrate vibrating membrane 106 with the same vibration period, the amplitude of vibrations of piezoelectric actuator 100 increases particularly in the vicinity of the resonance frequency.

Meanwhile, the resonance frequency of first piezoelectric vibrator 102 and the resonance frequency of second piezoelectric vibrator 104 may be different from each other. In this case, first piezoelectric vibrator 102 and second piezoelectric vibrator 104 significantly vibrate vibrating membrane 106 with frequency bands different from each other. Therefore, a frequency band in which the piezoelectric actuator is significantly vibrated widens, and thus frequency dependence of the sound pressure level of the piezoelectric actuator is further flattened. As described above, an audio component having a high degree of design freedom with which desired vibration amplitude can be obtained over the wide frequency band is realized.

Since first piezoelectric vibrator 102 and second piezoelectric vibrator 104 do not restrain each other in piezoelectric actuator 100 of the exemplary embodiment, it is easy to properly change the material and a shape of piezoelectric elements 112 and 114, the material and shape of pedestals 116 and 118, and the material and shape of vibrating membrane 106. Characteristics of piezoelectric actuator 100 can be easily adjusted by selecting such materials and shapes. Particularly, since change of the shape of pedestals 116 and 118 and change of a thickness of vibrating membrane 106 can be made without changing a size of support body 110, support body 110 can be used as a general-purpose component. Therefore, there is an advantage that manufacturing cost is reduced.

Although pedestals 116 and 118 of piezoelectric vibrators 102 and 104 are connected to vibrating membrane 106 in the above-described exemplary embodiment, piezoelectric elements 112 and 114 of piezoelectric vibrators 102 and 104 may be connected to vibrating membrane 106. In addition, it is also considered that first piezoelectric vibrator 102 and second piezoelectric vibrator 104 are connected to the same surface of vibrating membrane 106. Further, the number of the piezoelectric vibrators connected to vibrating membrane 106 may not be limited to two, but may be three or more. In these cases as well, if each piezoelectric vibrator is arranged straddling the opening of vibrating membrane 106 with low rigidity, it is possible to improve the amplitude of vibrations.

Figure 8:
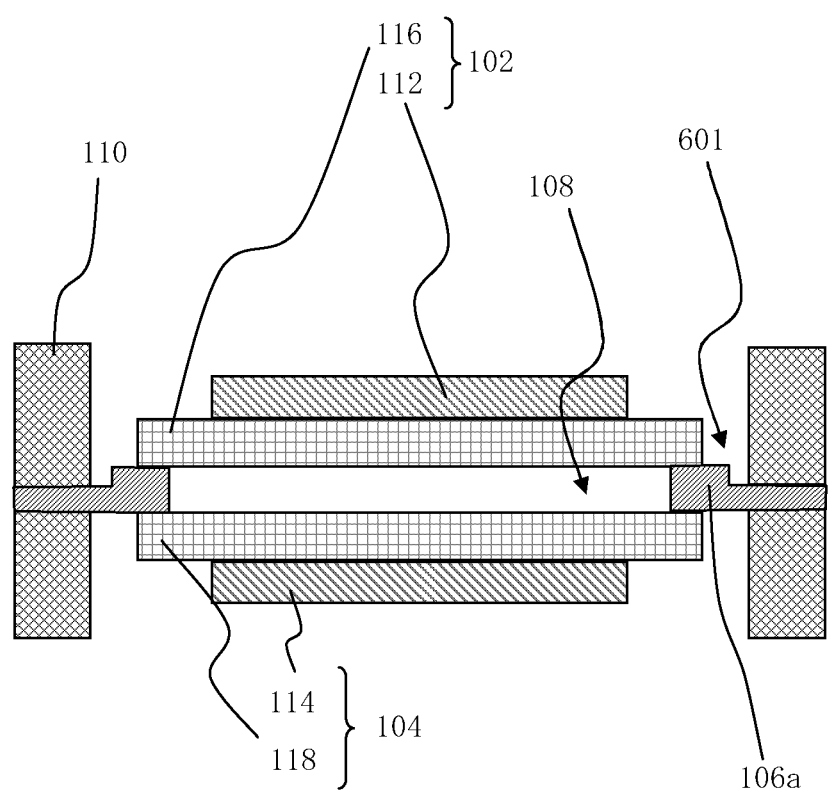
FIG. 8 is a schematic cross-sectional view according to one modified example of the piezoelectric actuator.
Figure 9:
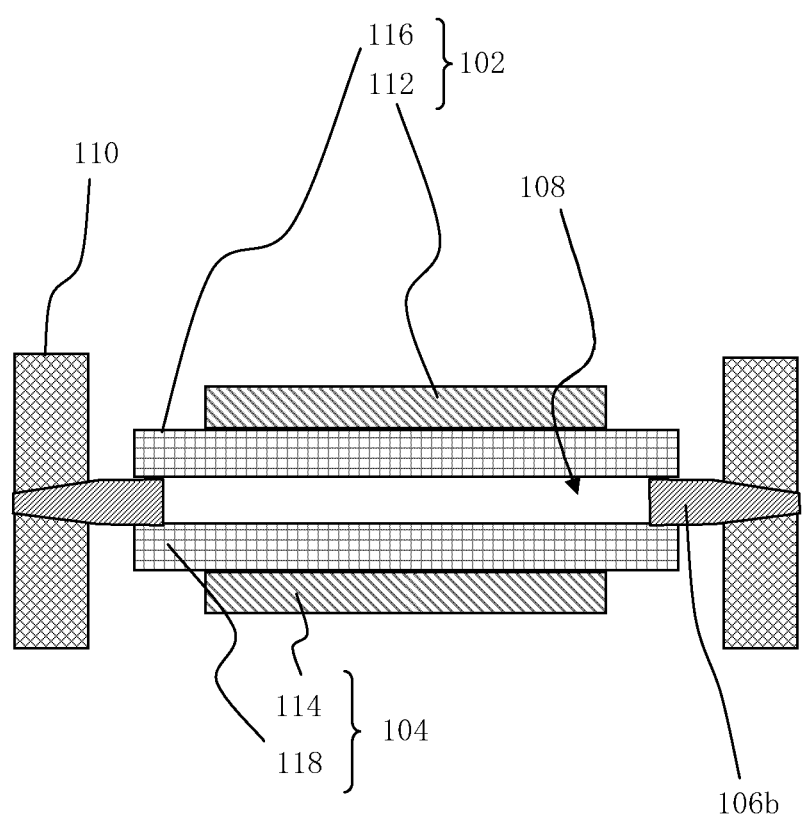
FIG. 9 is a schematic cross-sectional view according to another modified example of the piezoelectric actuator.
Figure 10:
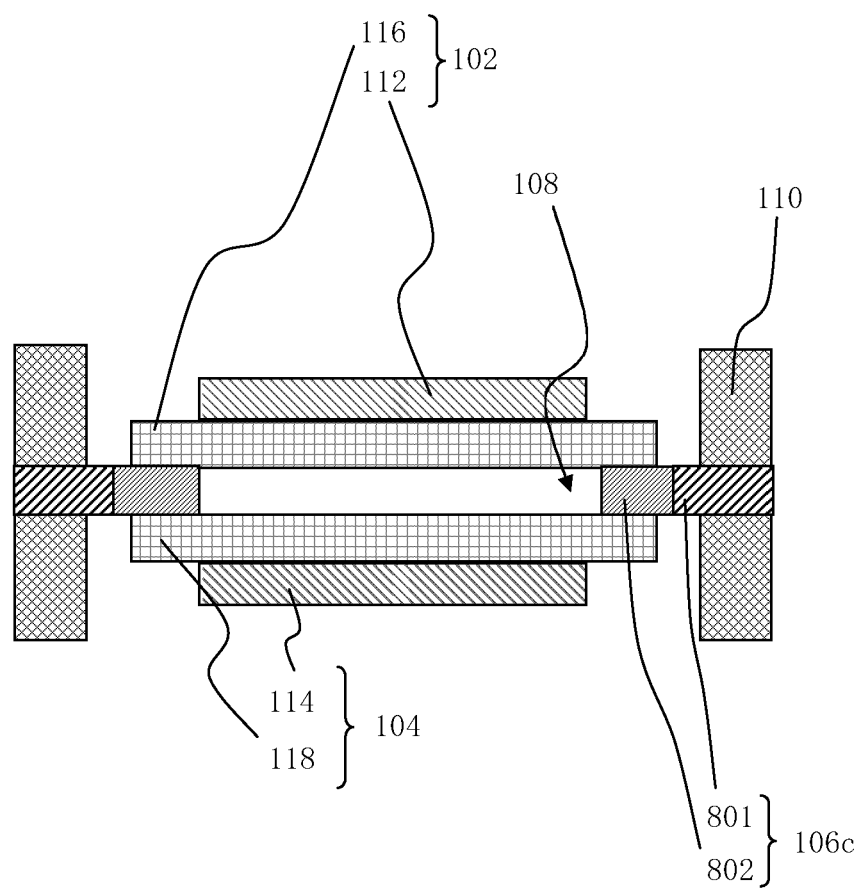
FIG. 10 is a schematic cross-sectional view according to another modified example of the piezoelectric actuator.

FIGS. 8 to 10 are schematic cross-sectional views showing modified examples of a piezoelectric actuator, and various examples of vibrating membranes are shown. In FIGS. 8 to 10, only vibrating membranes are different as compared with the piezoelectric actuator shown in FIGS. 3 and 4. Therefore, configurations of components other than the vibrating membrane will be omitted.

Vibrating membrane 106a whose thickness is not uniform is shown in FIG. 8. Specifically, the thickness of vibrating membrane 106a in the vicinity of opening 108 of vibrating membrane 106a is large, and the thickness of a portion of vibrating membrane 106a near support body 110 is small. Additionally, in order to change the thickness of vibrating membrane 106a, stepped portion 601 is provided on the way to an outer periphery from opening 108 of vibrating membrane 106a. Therefore, rigidity of the outer periphery of vibrating membrane 106a becomes lower as compared with a vibrating membrane with a uniform thickness. Lowering of the rigidity of an outer edge portion of vibrating membrane 106a reduces apparent rigidity as the entire structure of the piezoelectric actuator. Accordingly, the basic resonance frequency of the piezoelectric actuator is lowered, amplitude of vibrations of the vibrating membrane is increased, and frequency dependence of the amplitude is flattened.

Accordingly, when the piezoelectric actuator shown in FIG. 8 is utilized as an audio component, there is an advantage in which a sound pressure level is increased and the frequency dependence of the sound pressure level is flattened.

It is preferable that the thickness of the portion of vibrating membrane 106a near support body 110 be substantially half of the thickness of vibrating membrane 106a in the vicinity of opening 108 of vibrating membrane 106a. In addition, although a position of stepped portion 601 is not particularly limited, it is preferably provided in the middle of the outer edge portions of pedestals 116 and 118 and an inner wall of support body 110 in view of ease of manufacturing.

The thickness of vibrating membrane 106b shown in FIG. 9 becomes gradually smaller from opening 108 of vibrating membrane 106b toward an outer edge portion of vibrating membrane 106b. In this case as well, since rigidity of the outer edge portion of vibrating membrane 106b is lowered, an effect similar to the case of vibrating membrane 106a shown in FIG. 8 can be obtained.

In addition, since the thickness of vibrating membrane 106b shown in FIG. 9 gradually changes, there is also an advantage in which drive forces of piezoelectric vibrators 102 and 104 are smoothly transmitted to vibrating membrane 106b. As a result, amplitude of vibrations of the piezoelectric actuator is increased. Although a change in the rate of the thickness of vibrating membrane 106b is not particularly limited, it is preferable that a thickness of an outer edge portion of vibrating membrane 106b be substantially half of the thickness in the vicinity of opening 108 of vibrating membrane 106b.

In addition, although the thickness of vibrating membrane 106c shown in FIG. 10 is uniform, it is comprised of two materials that have different rigidity each other. Specifically, vibrating membrane 106c is comprised of first membrane portion 801 supported by support body 110, and second membrane portion 802 connected to pedestals 116 and 118. Additionally, first membrane portion 801 is comprised of a material with lower rigidity than second membrane portion 802. In this case as well, since rigidity of the outer edge portion of vibrating membrane 106c becomes lower, increase of amplitude of vibrations can be achieved similarly in the case of vibrating membrane 106a shown in FIG. 8. Further, it is possible to flatten frequency dependence of the amplitude of the vibrations by using a material with a high damping effect for first membrane portion 801. Although the position at which first membrane portion 801 and second membrane portion 802 are connected to each other is not particularly limited, it is preferably provided around a position in the middle of the outer edge portions of pedestals 116 and 118 and the inner wall of support body 110 in view of ease of manufacturing.

Although vibrating membrane 106c is comprised of two materials in the example shown in FIG. 10, the vibrating membrane may be comprised of three or more materials each having different rigidity.

Next, another modified example of a piezoelectric actuator will be described with reference to FIG. 11. In the piezoelectric actuator shown in FIG. 11, low rigidity member 901 with lower rigidity than vibrating membrane 106 is formed between vibrating membrane 106 and support body 110. As a result, the outer edge portion of vibrating membrane 106 can be easily deformed, and thus rigidity as the whole piezoelectric actuator is lowered. Additionally, vibration amplitude of vibrating membrane 106 is increased, and vibration frequency dependence of the vibration amplitude is flattened.

As materials included in low rigidity member 901, for example, urethane, isobutylene isoprene rubber, nitrile rubber, and silicon rubber can be considered. These materials are properly selected according to desired characteristics of the piezoelectric actuator.

Figure 12:
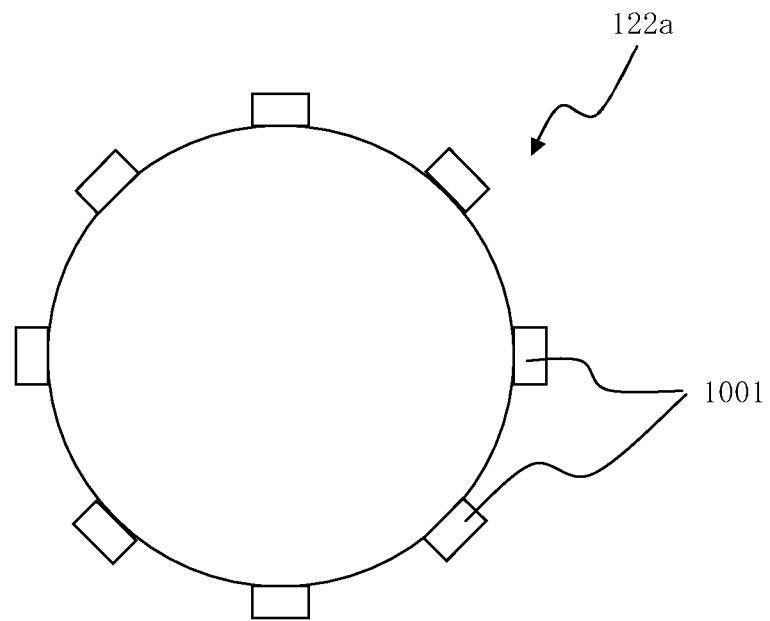
FIG. 12 is a schematic plan view showing one modified example of a pedestal of the piezoelectric actuator.

FIGS. 12 to 15 show various examples of pedestals used for the piezoelectric actuator of the present invention. Pedestal 122a shown in FIG. 12 is plate-shaped. Projecting portion 1001 protruding in a direction from a center of pedestal 122a toward an outside is formed in a periphery of pedestal 122a. This pedestal 122a is arranged straddling the opening of the vibrating membrane, and is connected to the vibrating membrane. At this time, projecting portion 1001 of pedestal 122a is connected to the vibrating membrane.

When such pedestal 112a is used, rigidity of pedestal 112a becomes low in the connection portion of pedestal 112a and the vibrating membrane. Further, stress at the time of vibrations concentrates on projecting portion 1001 of pedestal 112a. The apparent rigidity of the entire structure of the piezoelectric actuator is reduced due to this stress concentration and due to lowering of rigidity. Accordingly, the basic resonance frequency of the piezoelectric actuator becomes small, and the vibrating membrane is significantly bended and deformed, whereby amplitude of vibrations of the piezoelectric actuator is increased.

When the piezoelectric actuator using this pedestal 112a is utilized as an audio component, improvement of the sound pressure level and improvement of frequency characteristics can be achieved.

Figure 13:
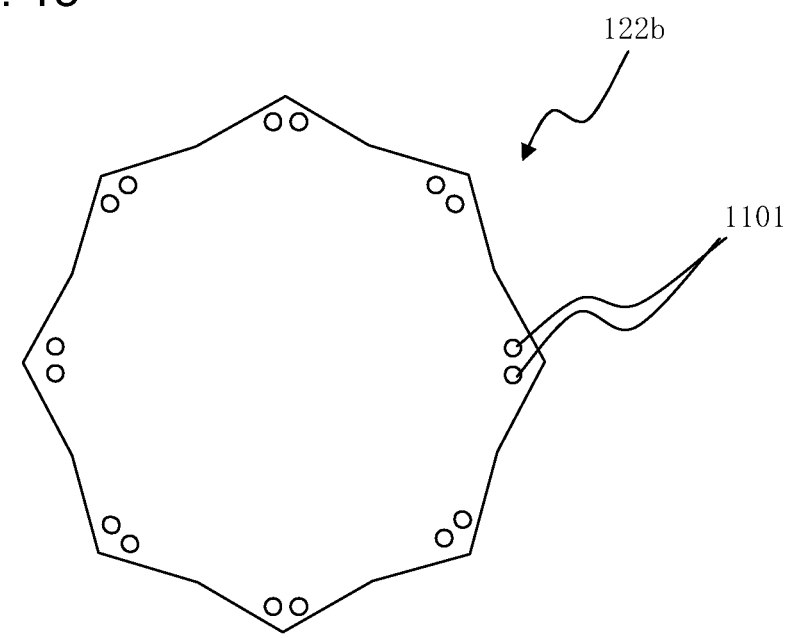
FIG. 13 is a schematic plan view showing another modified example of the pedestal of the piezoelectric actuator.

Pedestal 122b shown in FIG. 13 is plate-shaped. A periphery of pedestal 122b is formed jaggedly, and pedestal 122b is substantially petal-shaped. In this case as well, rigidity of the periphery of pedestal 122b is lowered, and stress concentrates on the periphery of pedestal 122b similarly to the pedestal shown in FIG. 12. As a result, the basic resonance frequency is lowered, and amplitude of vibrations is increased. As described above, vibration characteristics as the piezoelectric actuator is improved by reducing the rigidity of the periphery of the pedestal.

Figure 14:
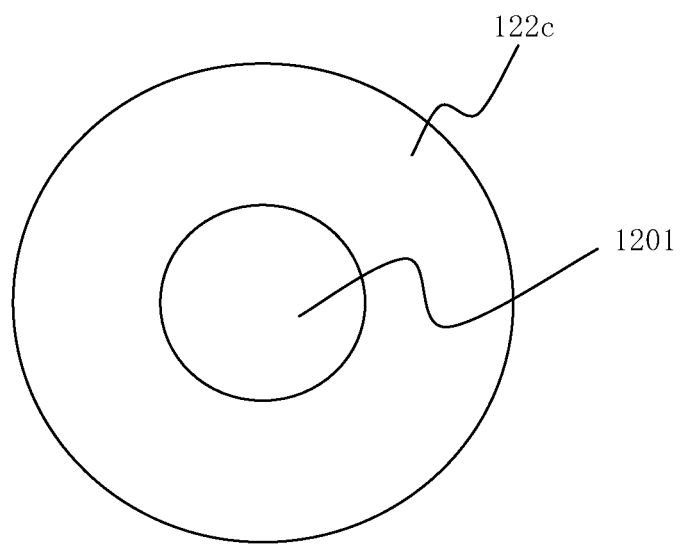
FIG. 14 is a schematic plan view showing another modified example of the pedestal of the piezoelectric actuator.
Figure 15:
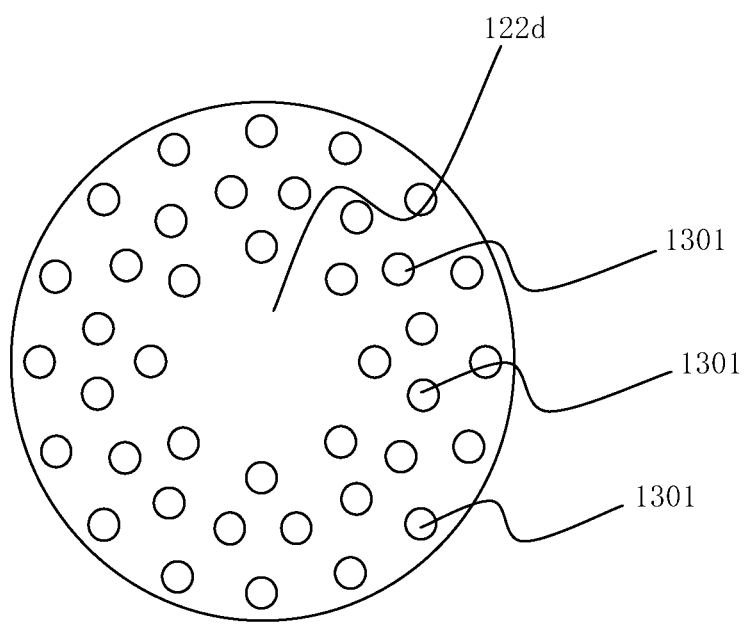
FIG. 15 is a schematic plan view showing still another modified example of the pedestal of the piezoelectric actuator.

Pedestal 122c shown in FIG. 14 is disc-shaped, and one opening 1201 is formed in the center thereof. As a result, there is an advantage that rigidity of pedestal 122c is lowered. In addition, pedestal 122d shown in FIG. 15 is disc-shaped having a plurality of openings 1301. Openings 1301 are scattered about a region excluding a central portion of pedestal 122d. As a result, rigidity of pedestal 122d is lowered.

Although the position, a size, and the number of the opening formed in the pedestal are not particularly limited, the opening is designed so as to realize lowering of the rigidity of the pedestal and/or concentration of stress on the pedestal.

One of pedestals 116, 118 that are included in piezoelectric vibrators 102 and 104 may be disc-shaped, and the other of pedestals 116, 118 may be the one shown in FIGS. 12 to 15. In addition, both first pedestal 116 and second pedestal 118 may be the one shown in FIGS. 12 to 15. A combination of first pedestal 116 and second pedestal 118 is properly selected according to the desired characteristics of the piezoelectric actuator.

Figure 16:
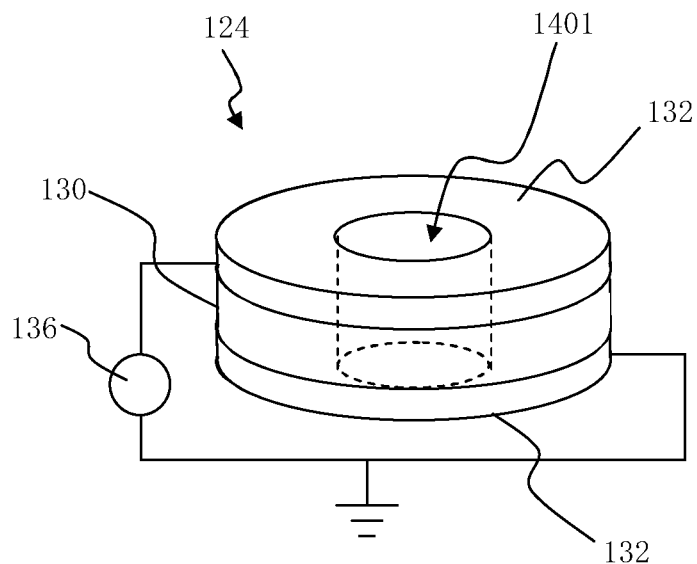
FIG. 16 is a schematic perspective view showing one modified example of a piezoelectric vibrator.

Another example of a piezoelectric element included in first and second piezoelectric vibrators 102 and 104 is shown in FIG. 16. Piezoelectric element 124 shown in FIG. 16 is disc-shaped, and opening 1401 is formed in the center thereof. In this case, rigidity of piezoelectric element 124 is lowered as compared with a piezoelectric element in which an opening is not formed. Accordingly, there is an advantage that rigidity as the whole piezoelectric actuator is lowered.

Next, piezoelectric actuators of the following exemplary embodiments 1 to 18 were actually manufactured, and characteristics thereof were evaluated to compare with the piezoelectric actuator of the comparative example (Refer to FIG. 1). These results are shown in the following Table 1. Evaluation items on the characteristics of the piezoelectric actuator are the next three items.

[Evaluation Item 1: Basic Resonance Frequency]

An alternating current whose effective voltage 1 V was applied to two piezoelectric elements included in the piezoelectric actuator, and a basic resonance frequency of the piezoelectric actuator was measured. The basic resonance frequency is measured as a peak value of a sound pressure level in frequency dependence of the sound pressure level. In Table 1, indicated are resonance frequencies standardized with a measurement result with respect to the piezoelectric actuator of the comparative example being as a reference value. Here, a frequency and amplitude of the alternating currents applied to two piezoelectric elements were set to be the same as each other.

[Evaluation Item 2: Sound Pressure]

Measured was a sound pressure level in a basic resonance frequency when the alternating current whose effective voltage is 1 V was applied. In Table 1, indicated are sound pressure levels standardized based on a sound pressure level in the piezoelectric actuator of the comparative example. It is to be noted that the sound pressure levels were measured by a microphone arranged separated from the piezoelectric actuator by 10 cm.

[Evaluation Item 3: Flattening of Frequency Dependence of Sound Pressure]

Measured was frequency dependence of a sound pressure level when the alternating current, whose effective voltage is 1 V, is applied. Subsequently, the fluctuation range of the sound pressure level from the sound pressure level in the basic resonance frequency is calculated, and the magnitude of the fluctuation range was evaluated. In Table 1, "A" is indicated if the fluctuation range of the sound pressure level is within 10 dB, "B" is indicated if the fluctuation range is larger than 10 dB and within 15 dB, and "C" if larger than 15 dB in a frequency band of 100 Hz to 10 kHz. It means that the smaller the fluctuation range of the sound pressure level, the higher is the flatness of the frequency dependence of the sound pressure level.

[Evaluation Item 4: Impact Resistance]

Resistance tests on impact were performed by naturally dropping five times a mobile phone in which is mounted the piezoelectric actuator of the exemplary embodiment or the comparative example from the height of 50 cm. Specifically, measured were the sound pressure level in the basic resonance frequency of the piezoelectric actuator to which the impact had not been given yet and the sound pressure level in the basic resonance frequency of the piezoelectric actuator to which the impact had already been given, and the difference between those sound pressure levels (Hereinafter referred to as a "sound pressure level difference".) was calculated. Accordingly, this means that the smaller the sound pressure level difference, the higher is the resistance to the impact. In Table 1, "A" is indicated if the sound pressure level difference is within 3 dB, and "B" is indicated if the sound pressure level difference is larger than 3 dB.

TABLE 1

|  | Standardized resonance frequency | Standardized sound pressure level | Flatness of sound pressure level | Impact resistance |
| --- | --- | --- | --- | --- |
| Comparative Example | 1.00 | 1.0 | C | B |
| Exemplary embodiment 1 | 0.69 | 3.0 | B | A |
| Exemplary embodiment 2 | 0.63 | 2.7 | A | A |
| Exemplary embodiment 3 | 0.72 | 2.9 | A | A |
| Exemplary embodiment 4 | 0.59 | 3.3 | A | A |
| Exemplary embodiment 5 | 0.58 | 3.1 | A | A |
| Exemplary embodiment 6 | 0.53 | 4.2 | B | A |
| Exemplary embodiment 7 | 0.63 | 3.8 | A | A |
| Exemplary embodiment 8 | 0.63 | 3.6 | A | A |
| Exemplary embodiment 9 | 0.66 | 3.5 | B | A |
| Exemplary embodiment 10 | 0.59 | 3.8 | A | A |
| Exemplary embodiment 11 | 0.56 | 3.9 | B | A |
| Exemplary embodiment 12 | 0.59 | 3.9 | A | A |
| Exemplary embodiment 13 | 0.56 | 4.0 | B | A |
| Exemplary embodiment 14 | 0.54 | 3.5 | B | A |
| Exemplary embodiment 15 | 0.66 | 4.2 | A | A |
| Exemplary embodiment 16 | 0.69 | 2.8 | B | A |
| Exemplary embodiment 17 | 0.66 | 2.5 | A | A |
| Exemplary embodiment 18 | 0.60 | 4.0 | A | A |

Next, detailed configurations of the comparative example and each exemplary embodiment will be described.

COMPARATIVE EXAMPLE

The piezoelectric actuator of the comparative example is shown in FIG. 1. It is to be noted that piezoelectric element 3212, pedestal 3216, and support body 3210 are comprised of the same material as the piezoelectric element, the pedestal, and the support body of exemplary embodiment 1, which will be described hereinafter.

Piezoelectric element 3212 of the comparative example is disc-shaped, and the diameter thereof is 17 millimeters. The thickness of a piezoelectric body of piezoelectric element 3212 is 40 μm. Electrode layer of 8 μm thickness is formed on both surfaces of the piezoelectric body, respectively. Pedestal 3216 is comprised of disk-shaped phosphor bronze, the diameter thereof is 19 millimeters, and the thickness thereof is 50 μm. Support body 3210 has a circular frame shape comprised of stainless steel (SUS304). The outer diameter of support body 3210 is 21 millimeters, and the inner diameter of support body 3210 is 20 millimeters. In addition, the thickness of support body 3210 is 0.5 millimeter.

Piezoelectric element 3212, pedestal 3216, and support body 3210 are arranged in a concentric pattern. The piezoelectric body of piezoelectric element 3212 is comprised of titanic acid lead zirconate ceramics, and the electrode layer of piezoelectric element 3212 is comprised of silver/palladium alloy (weight ratio 7:3). This piezoelectric element 3212 is manufactured by a green sheet method, and it is burned for over two hours at a temperature of 1100° C. in the atmosphere. After that, polarization treatment is performed on the piezoelectric body. Adhesion between piezoelectric element 3212 and pedestal 3216, and adhesion between support body 3210 and pedestal 3216 were both performed using epoxy adhesive. It is to be noted that the basic resonance frequency of piezoelectric actuator 3200 of the comparative example was 1800 Hz.

Exemplary Embodiment 1

The piezoelectric actuator of exemplary embodiment 1 has the same configuration as the piezoelectric actuator shown in FIGS. 3 and 5. A specific configuration of each portion of the piezoelectric actuator is as follows.

First piezoelectric element 112 and second piezoelectric element 114 are disc-shaped, and the diameter thereof is 17 millimeters. Additionally, the thickness of a piezoelectric body included in piezoelectric elements 112 and 114 is 40 µm, and an electrode layer of 8 µm thickness is formed on both surfaces of the piezoelectric body.

First pedestal 116 and second pedestal 118 are disc-shaped, and they are comprised of phosphor bronze. A diameter of first pedestal 116 and second pedestal 118 is 19 millimeters, and a thickness thereof is 50 µm.

Vibrating membrane 106 is a circular membrane comprised of polyethylene terephthalate (PET), and circular opening 108 is formed in the center thereof. The diameter of vibrating membrane 106 is 21 millimeters, the diameter of opening 108 of vibrating membrane is 17 millimeters, and the thickness of vibrating membrane 106 is 25 µm.

Support body 110 has a circular frame shape comprised of stainless steel (SUS304). The outer diameter of support body 110 is 21 millimeters, the inner diameter of support body 110 is 20 millimeters, and the thickness of support body 110 is 0.5 millimeter. Here, the thickness of support body 110 means the width of support body 110 in direction Q perpendicular to the membrane surface of vibrating membrane 106.

The piezoelectric bodies of piezoelectric elements 112 and 114 are comprised of titanic acid lead zirconate ceramics. Electrode layers of piezoelectric vibrator 112 and 114 are comprised of silver/palladium alloy (weight ratio 7:3). These piezoelectric elements 112 and 114 are manufactured by the green sheet method, they are burned for over two hours at a temperature of 1100° C. in the atmosphere, and subsequently, polarization treatment is performed on the piezoelectric bodies.

Epoxy adhesive was used as a connecting material to connect each component member of the piezoelectric actuator. The shape, material, etc. of the each component member are also similar in following exemplary embodiments unless these are clearly described.

Referring to Table 1, the standardized resonance frequency is 0.69 in the piezoelectric actuator of the exemplary embodiment 1, and this resonance frequency is lower than the resonance frequency of the piezoelectric actuator of the comparative example. Further, the sound pressure level is higher and frequency dependence of the sound pressure level is more flattened than in the comparative example. In addition, it is confirmed that stability with respect to the impact of the piezoelectric actuator of the exemplary embodiment 1 is also high. In addition, the thickness of the piezoelectric actuator (thickness including the support body, the vibrating membrane, and the adhesive material) is approximately 1.1 millimeters, and thus it is sufficiently thin.

Exemplary Embodiment 2

Figure 17:
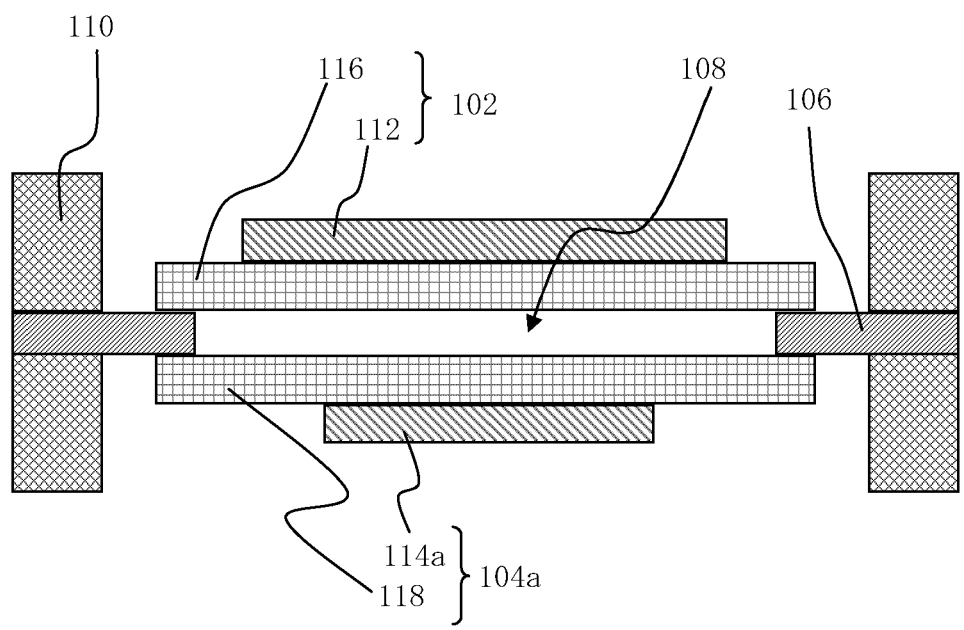
FIG. 17 is a schematic cross-sectional view of a piezoelectric actuator according to an exemplary embodiment 2.

The piezoelectric actuator shown in FIG. 17 was fabricated as exemplary embodiment 2. In the piezoelectric actuator of the exemplary embodiment 2, the size of second piezoelectric element 114a differs as compared with that of the exemplary embodiment 1. Specifically, second piezoelectric element 114a is disc-shaped, and the diameter thereof is 10 millimeters. Additionally, the thickness of a piezoelectric body of second piezoelectric element 114a is 40 µm, and an electrode layer of 8 µm thickness is formed on both surfaces of the piezoelectric body. The other configurations are the same as in the first embodiment.

As compared with exemplary embodiment 1, the basic resonance frequency of the piezoelectric actuator of exemplary embodiment 2 is further lowered. Therefore, the sound pressure level of the piezoelectric actuator increases in a low frequency band. Further, since piezoelectric vibrators 102 and 104a that have different frequency characteristics of vibrations are connected to same vibrating membrane 106, flatness of the frequency dependence of the sound pressure level is improved. In addition, stability with respect to the impact is high similarly in exemplary embodiment 1.

Exemplary Embodiment 3

Figure 18:
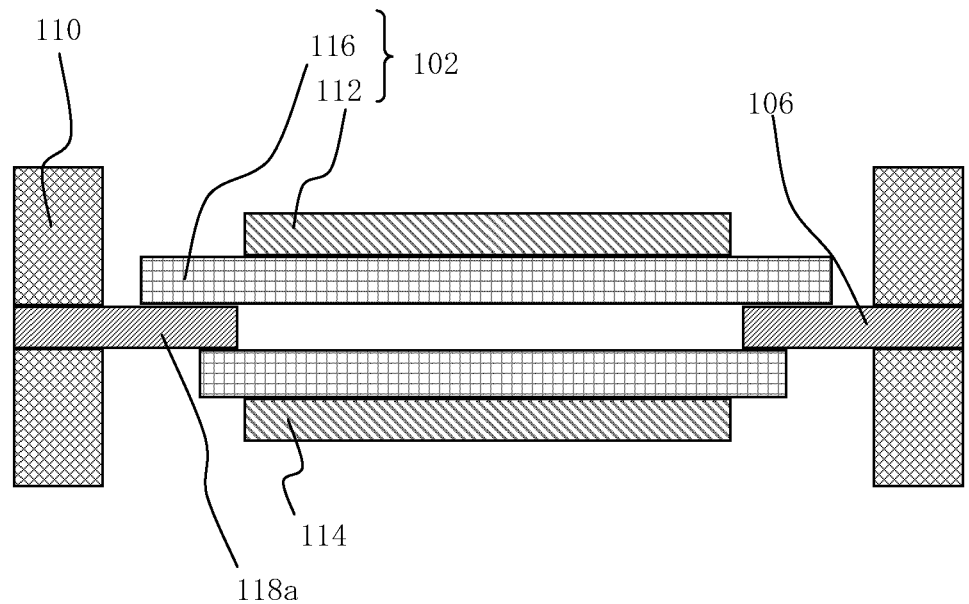
FIG. 18 is a schematic cross-sectional view of a piezoelectric actuator according to an exemplary embodiment 3.

The piezoelectric actuator shown in FIG. 18 was fabricated as an exemplary embodiment 3. In the piezoelectric actuator of the exemplary embodiment 3, the diameter of second pedestal 118a is smaller than the diameter of first pedestal 116. Specifically, second pedestal 118a is disc-shaped, the diameter thereof is 18 millimeters, and the thickness thereof is 50 µm. The other configurations are the same as in the first embodiment.

According to the piezoelectric actuator of the exemplary embodiment 2, frequency dependence of the sound pressure level was flattened as compared with exemplary embodiment 1. This is because two pedestals 116 and 118a that have different frequency characteristics of vibrations were used.

Exemplary Embodiment 4

Figure 19:
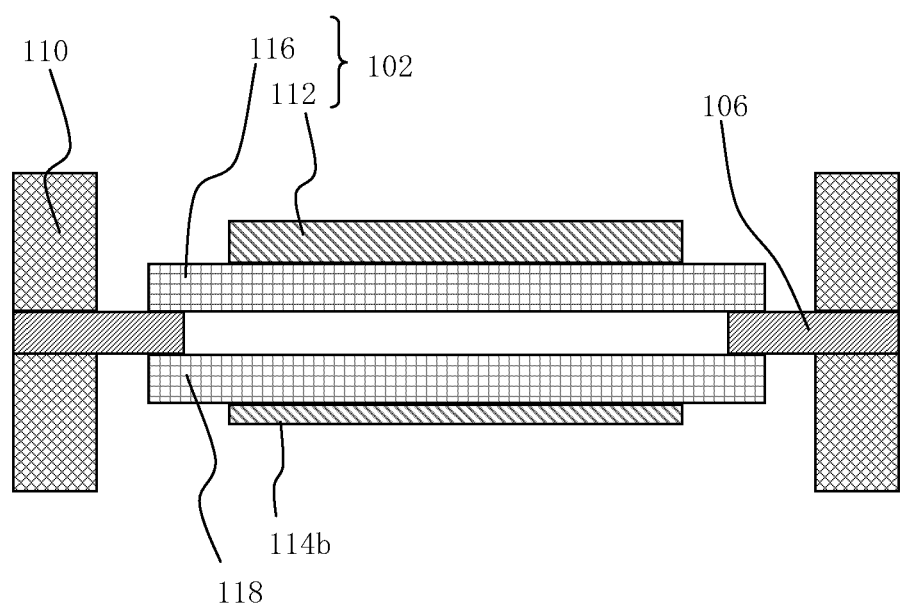
FIG. 19 is a schematic cross-sectional view of a piezoelectric actuator according to an exemplary embodiment 4.

A piezoelectric actuator shown in FIG. 19 was fabricated as an exemplary embodiment 4. In the piezoelectric actuator of the exemplary embodiment 4, the thickness of second piezoelectric element 114b is smaller than the thickness of first piezoelectric element 112. Specifically, second piezoelectric element 114b is disc-shaped, and the outer diameter thereof is 17 millimeters. The thickness of a piezoelectric body of second piezoelectric element 114b is 30 µm, and an electrode layer of 8 µm thickness is formed on both surfaces of the piezoelectric body. The other configurations are the same as in the first embodiment.

According to the piezoelectric actuator of the exemplary embodiment 4, the sound pressure level thereof improves more than that of the piezoelectric actuator of comparative example 1. This is because the resonance frequency becomes small due to the reduced thickness of the piezoelectric body, and further the electric field applied to second piezoelectric element 114b becomes higher than the electric field applied to first piezoelectric element 112. In addition, frequency dependence of the sound pressure level is flattened, and stability with respect to the impact is high.

Exemplary Embodiment 5

Figure 20:
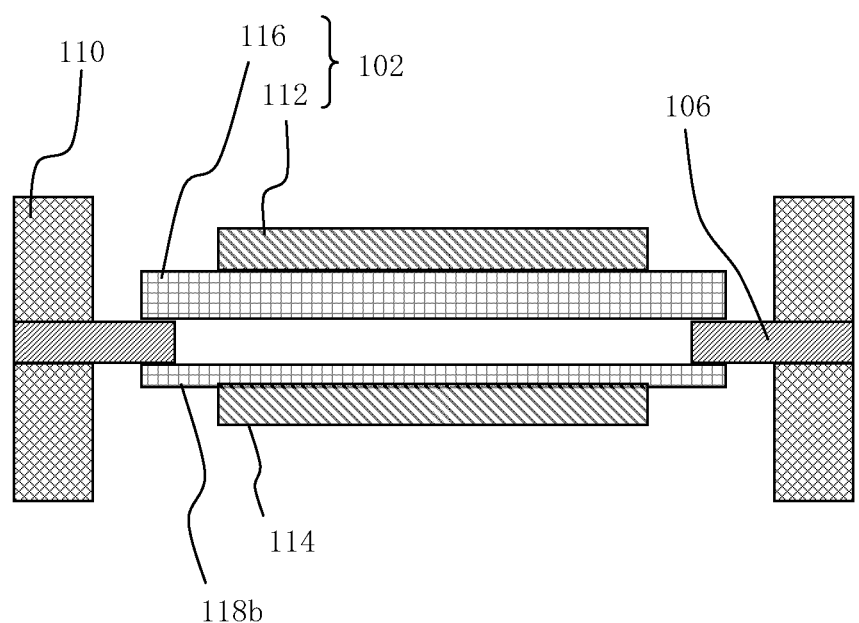
FIG. 20 is a schematic cross-sectional view of a piezoelectric actuator according to an exemplary embodiment 5.

The piezoelectric actuator shown in FIG. 20 was fabricated as an exemplary embodiment 5. In the piezoelectric actuator of the exemplary embodiment 5, the thickness of second pedestal 118b is smaller than the thickness of first pedestal 116 as compared with exemplary embodiment 1. First pedestal 116 is the same as in exemplary embodiment 1. Second pedestal 118b is disc-shaped, the diameter thereof is 19 millimeters, and the thickness thereof is 20 µm. The other configurations are the same as in the first embodiment.

According to the piezoelectric actuator of exemplary embodiment 5, the thickness of second pedestal 118b is small, and rigidity of the second piezoelectric vibrator becomes small. Therefore, the resonance frequency of the piezoelectric actuator becomes smaller than in exemplary embodiment 1. As a result, a high sound pressure level can be obtained in the low frequency band. Further, flatness of frequency dependence of the sound pressure level is improved, and stability with respect to the impact is high.

Exemplary Embodiment 6

The above-mentioned piezoelectric actuator shown in FIG. 8 was fabricated as exemplary embodiment 6. In the piezoelectric actuator of exemplary embodiment 6, vibrating membrane 106a is different from the vibrating membrane of exemplary embodiment 1. Specifically, the thickness of vibrating membrane 106a is not uniform.

Figure 21:
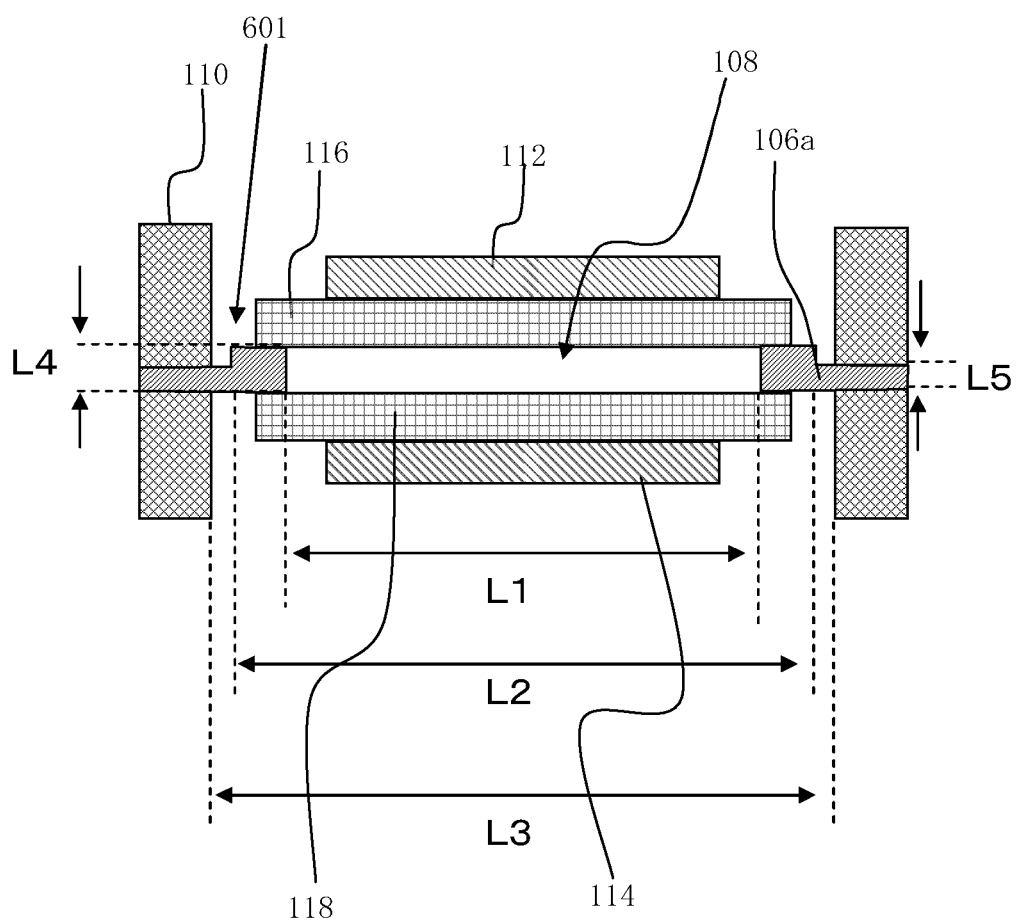
FIG. 21 is a schematic cross-sectional view of a piezoelectric actuator according to an exemplary embodiment 6.

FIG. 21 is a schematic view for showing the shape of vibrating membrane 106a included in the piezoelectric actuator of the exemplary embodiment 6. As shown in FIG. 21, diameter L1 of opening 108 of vibrating membrane 106a is 17 millimeters. Stepped portion 601 of vibrating membrane 106a is formed substantially circular, and diameter L2 thereof is 19.5 millimeters. In addition, diameter L3 of vibrating membrane 106a is 20 millimeters. Further, thickness L4 near opening 108 of the vibrating membrane is 25 μm, and thickness L5 of the portion of vibrating membrane 106a supported by support body 110 is 16 μm. Configurations of the component members excluding vibrating membrane 106a are the same as in the first embodiment.

According to the piezoelectric actuator of exemplary embodiment 6, the basic resonance frequency becomes small, and a high sound pressure level can be obtained in the low frequency band as compared with the exemplary embodiments 1 to 5. This is because the thickness of the outer periphery of vibrating membrane 106a is small and because vibrating membrane 106a has low rigidity with respect to bending deformation. Further, frequency dependence of the sound pressure level is substantially flattened similar to exemplary embodiment 1, and stability with respect to the impact is high.

Exemplary Embodiment 7

Figure 22:
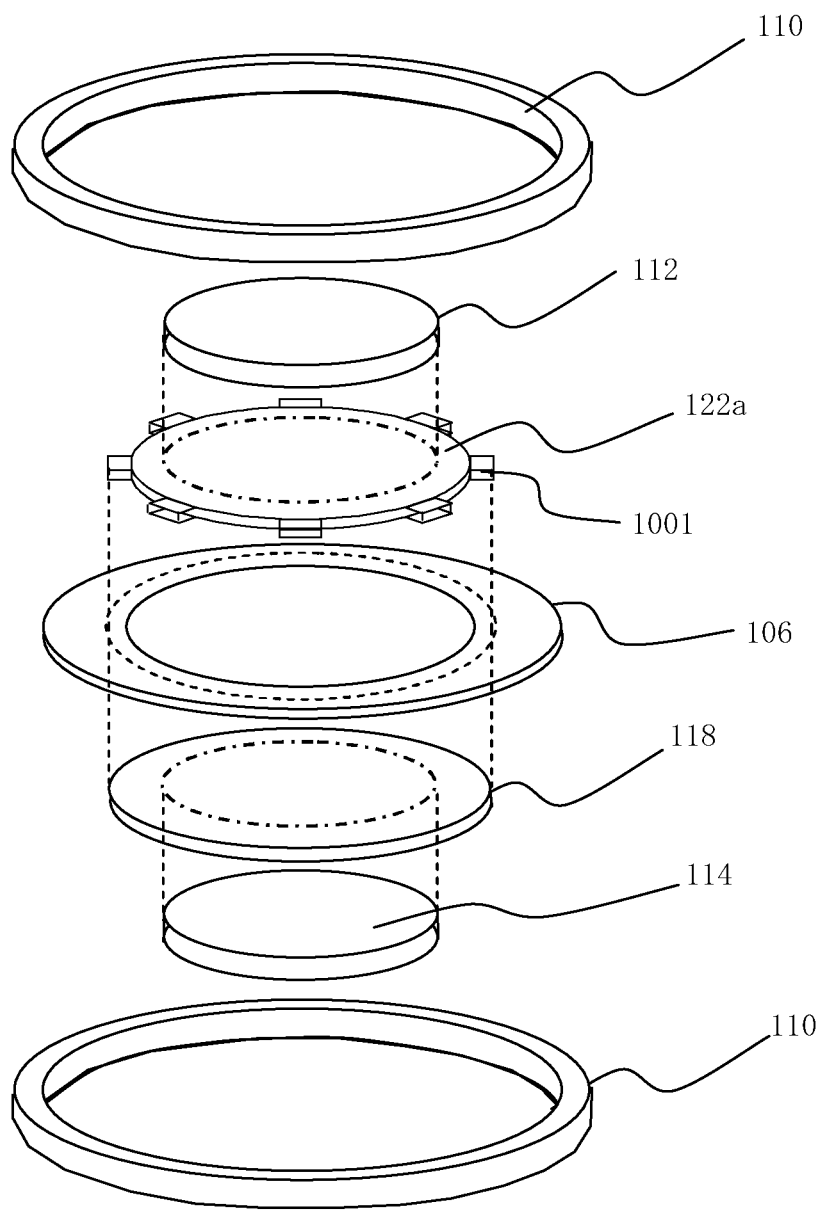
FIG. 22 is a schematic exploded perspective view of a piezoelectric actuator according to an exemplary embodiment 7.

The piezoelectric actuator shown in FIG. 22 was fabricated as an exemplary embodiment 7. In the piezoelectric actuator of the exemplary embodiment 7, the first pedestal differs as compared with exemplary embodiment 1. Specifically, the pedestal shown in FIG. 12 was used as first pedestal 122a. The other configurations are the same as in exemplary embodiment 1.

Figure 23:
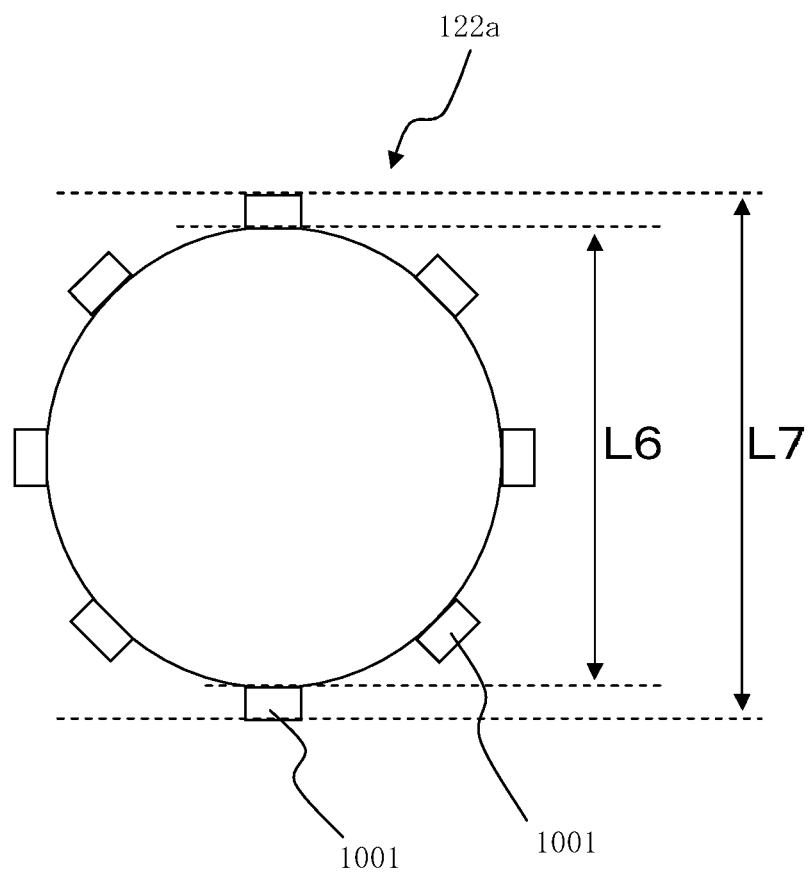
FIG. 23 is a schematic view for illustrating a shape of a first pedestal of the piezoelectric actuator according to the exemplary embodiment 7.

FIG. 23 is a schematic view for illustrating the size of first pedestal 122a of exemplary embodiment 7. First pedestal 122a is substantially disc-shaped, and projecting portion 1001 is formed on a periphery thereof. Diameter L6 of the disk is 18 millimeters, and size L7 of first pedestal 122a including projecting portion 1001 is 19 millimeters.

According to the piezoelectric actuator of exemplary embodiment 7, the basic resonance frequency became smaller than the exemplary embodiment 1, and a high sound pressure level could be obtained in the low frequency band. This is because rigidity of the outer edge portion of first pedestal 122a is lowered, and stress concentrates on projecting portion 1001. Further, since first pedestal 122a and second pedestal 118 are different from each other, frequency characteristics of two piezoelectric vibrators are different from each other. For that reason, frequency dependence of the sound pressure level of the piezoelectric actuator is flattened. In addition, stability with respect to the impact is high similar to comparative example 1.

Exemplary Embodiment 8

Figure 24:
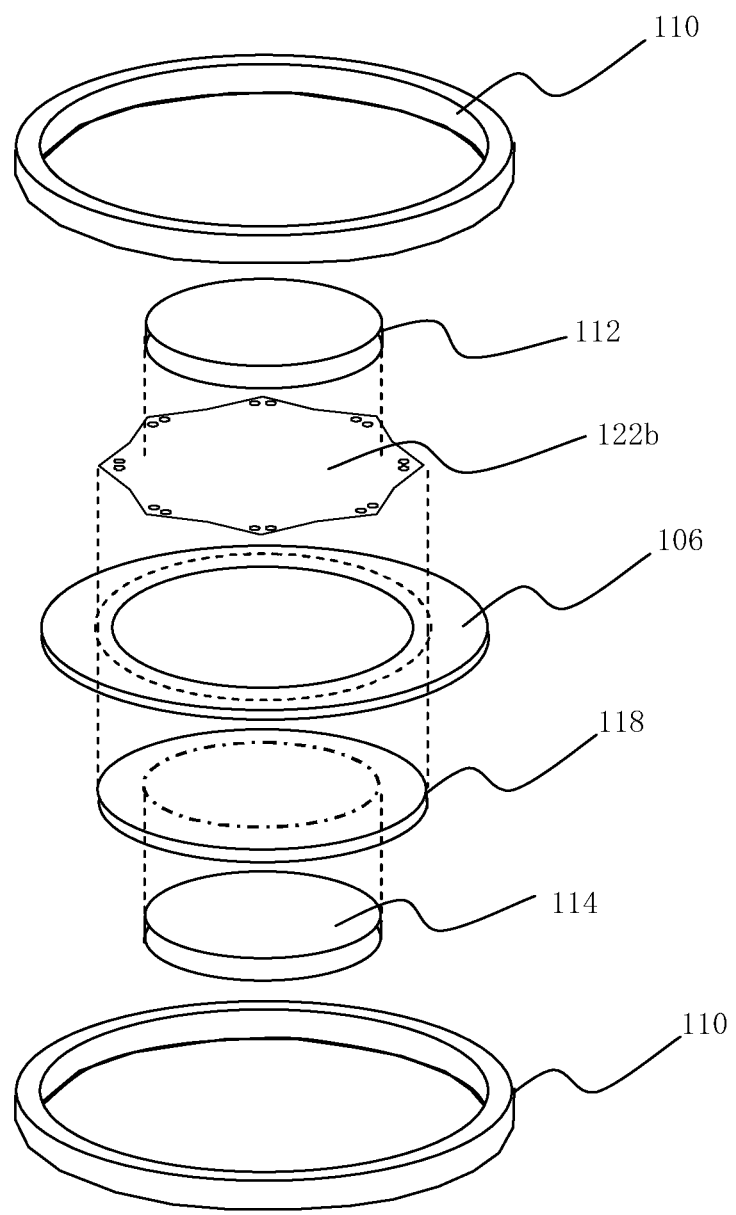
FIG. 24 is a schematic exploded perspective view of a piezoelectric actuator according to an exemplary embodiment 8.

The piezoelectric actuator shown in FIG. 24 was fabricated as an exemplary embodiment 8. In the piezoelectric actuator of the exemplary embodiment 8, the shape of a first pedestal differs as compared with exemplary embodiment 1. Specifically, a pedestal shown in FIG. 13 was used as first pedestal 122b. The other configurations are the same as in the first embodiment.

Figure 25:
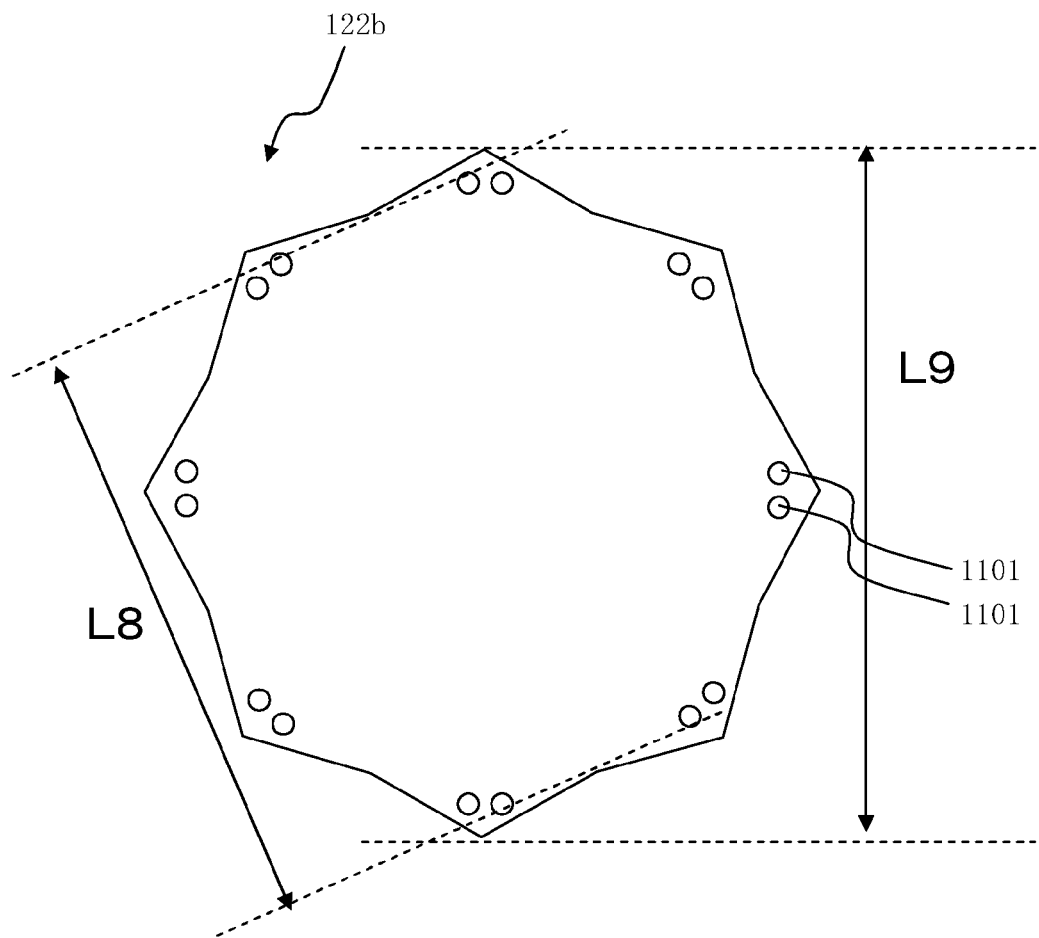
FIG. 25 is a schematic view for illustrating a shape of a first pedestal of the piezoelectric actuator according to the exemplary embodiment 8.

FIG. 25 is a schematic view for illustrating the size of first pedestal 122b of exemplary embodiment 8. Length L8 in the drawing is 18 millimeters, and length L9 in the drawing is 19 millimeters. In addition, opening 1101 formed in the first pedestal 122b is circular, and the diameter thereof is 1 millimeter.

According to the piezoelectric actuator of exemplary embodiment 8, rigidity of an outer edge portion of first pedestal 122b is lowered, and further stress concentrates. As a result, the resonance frequency becomes smaller than in exemplary embodiment 1. Further, a high sound pressure level can be obtained in the low frequency band as compared with exemplary embodiment 1. Further, frequency dependence of the sound pressure level is flattened, and stability with respect to the impact is high.

Exemplary Embodiment 9

Figure 26:
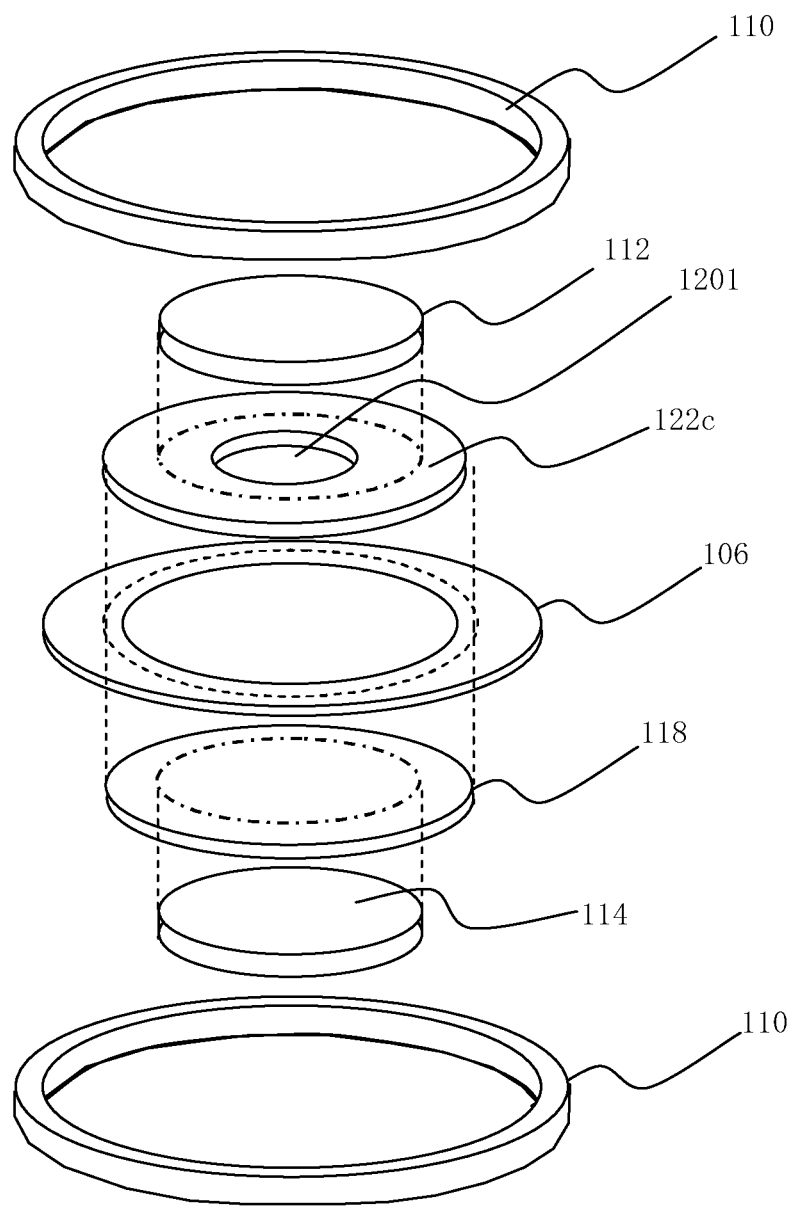
FIG. 26 is a schematic exploded perspective view of a piezoelectric actuator according to an exemplary embodiment 9.

The piezoelectric actuator shown in FIG. 26 was fabricated as an exemplary embodiment 9. In the piezoelectric actuator of exemplary embodiment 9, a first pedestal differs as compared with exemplary embodiment 1. First pedestal 122c is the same as the above-mentioned pedestal shown in FIG. 14. The diameter of opening 1201 of first pedestal 122c is 5 millimeters. The other configurations are the same as in the first embodiment.

According to the piezoelectric actuator of exemplary embodiment 9, the resonance frequency became lower than in exemplary embodiment 1, and the sound pressure level was improved in the low frequency band. This is because opening 1201 was formed in first pedestal 122c and the rigidity of first pedestal 122c was lowered. Further, frequency dependence of the sound pressure level is substantially flattened similar to exemplary embodiment 1, and stability with respect to the impact is high.

Exemplary Embodiment 10

Figure 27:
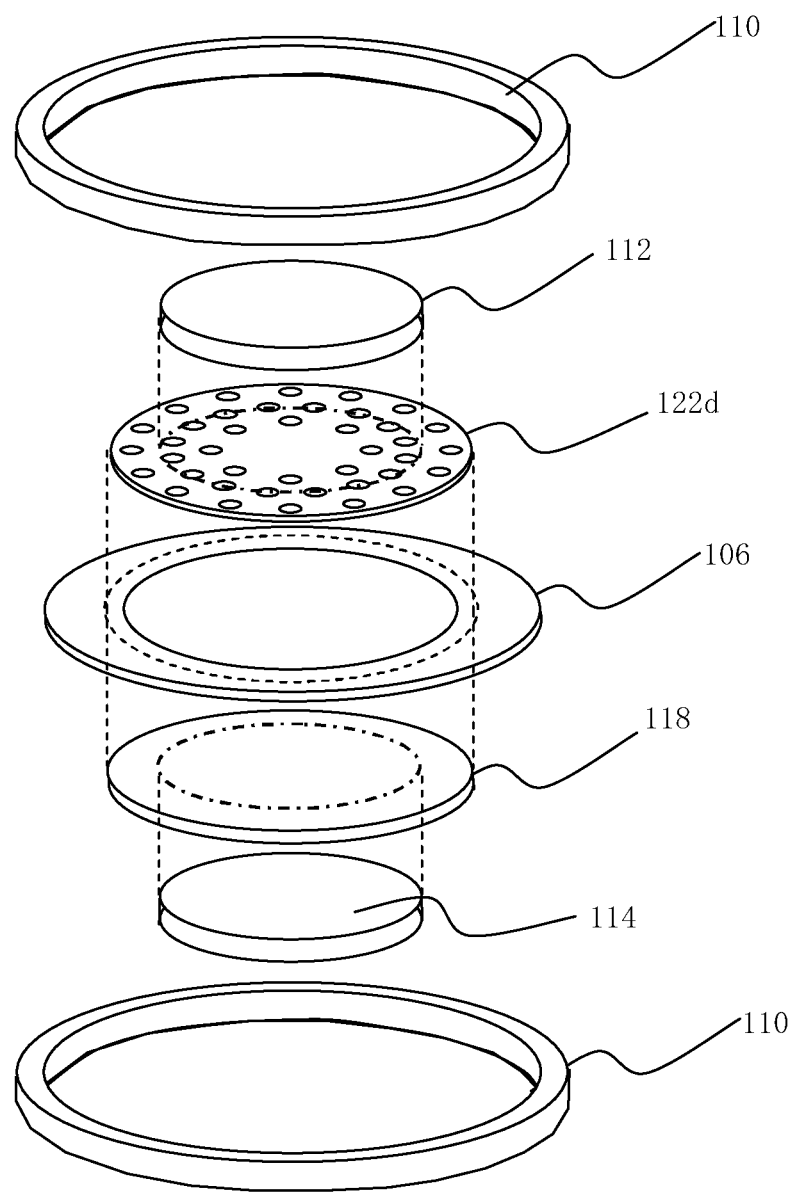
FIG. 27 is a schematic exploded perspective view of a piezoelectric actuator according to an exemplary embodiment 10.

A piezoelectric actuator shown in FIG. 27 was fabricated as exemplary embodiment 10. In the piezoelectric actuator of the exemplary embodiment, the first pedestal differs as compared with exemplary embodiment 1. First pedestal 122d is the same as the pedestal shown in FIG. 15, and it has a plurality of openings 1301. The diameter of each opening 1301 of first pedestal 122d is 1 millimeter. The other configurations are the same as in the first embodiment.

According to the piezoelectric actuator of the exemplary embodiment 10, openings 1301 were formed in first pedestal 122d, whereby rigidity of first pedestal 122d was lowered, and the basic resonance frequency of the piezoelectric actuator became lower than in the exemplary embodiment 1. Additionally, the high sound pressure level could be obtained in the low frequency band as compared with exemplary embodiment 1. It was confirmed that flatness of frequency characteristics of the sound pressure level and stability with respect to the impact was also excellent.

Exemplary Embodiment 11

Figure 28:
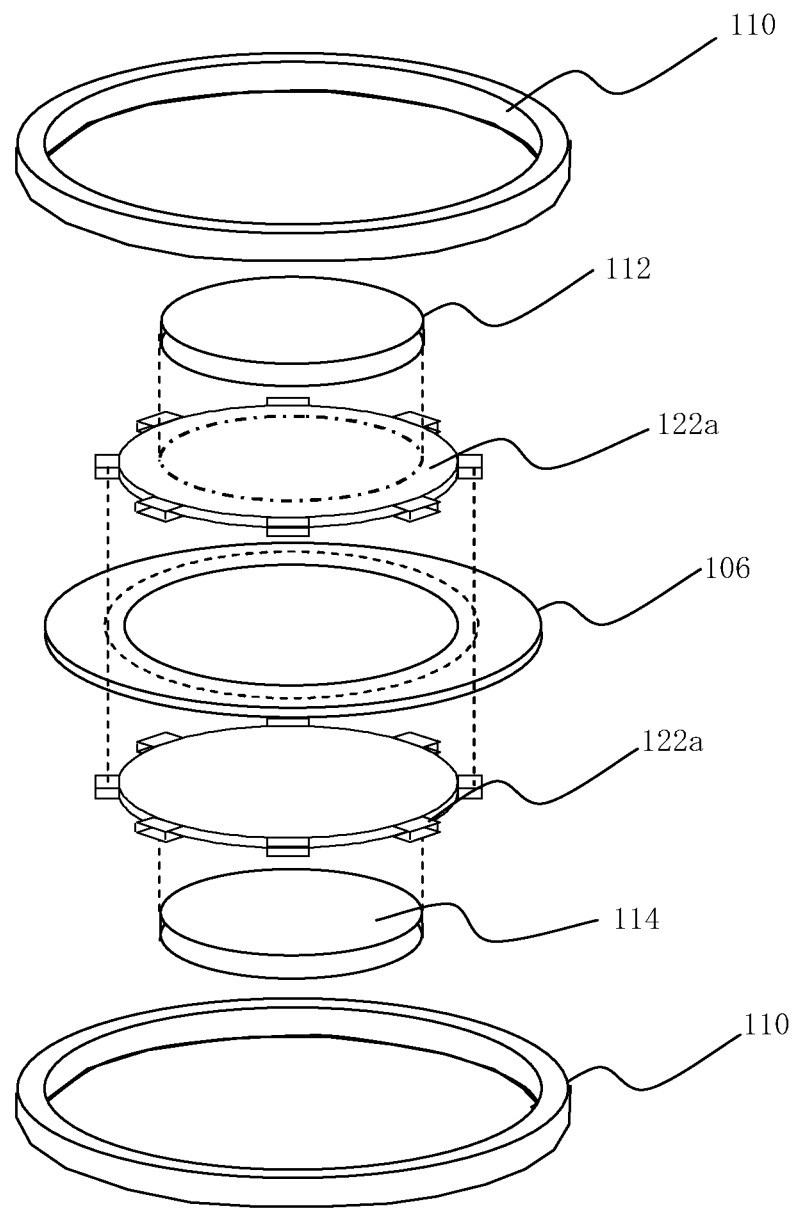
FIG. 28 is a schematic exploded perspective view of a piezoelectric actuator according to an exemplary embodiment 11.

The piezoelectric actuator shown in FIG. 28 was fabricated as an exemplary embodiment 11. In the piezoelectric actuator of exemplary embodiment 11, the first pedestal and the second pedestal differ as compared with exemplary embodiment 1. Specifically, first and second pedestals 122*a* are the same as the pedestal shown in FIG. 12. The other configurations are the same as in the first embodiment.

According to the piezoelectric actuator of exemplary embodiment 11, the basic resonance frequency became smaller than exemplary embodiment 1 due to lowering of the rigidity of the outer edge portion of pedestal 122*a* and stress concentration on projecting portion 1001. Further, a high sound pressure level could be obtained in the low frequency band as compared with the exemplary embodiment 1. In addition, flatness of frequency characteristics of the sound pressure level substantially similar to exemplary embodiment 1 and stability with respect to the impact could be obtained.

Exemplary Embodiment 12

Figure 29:
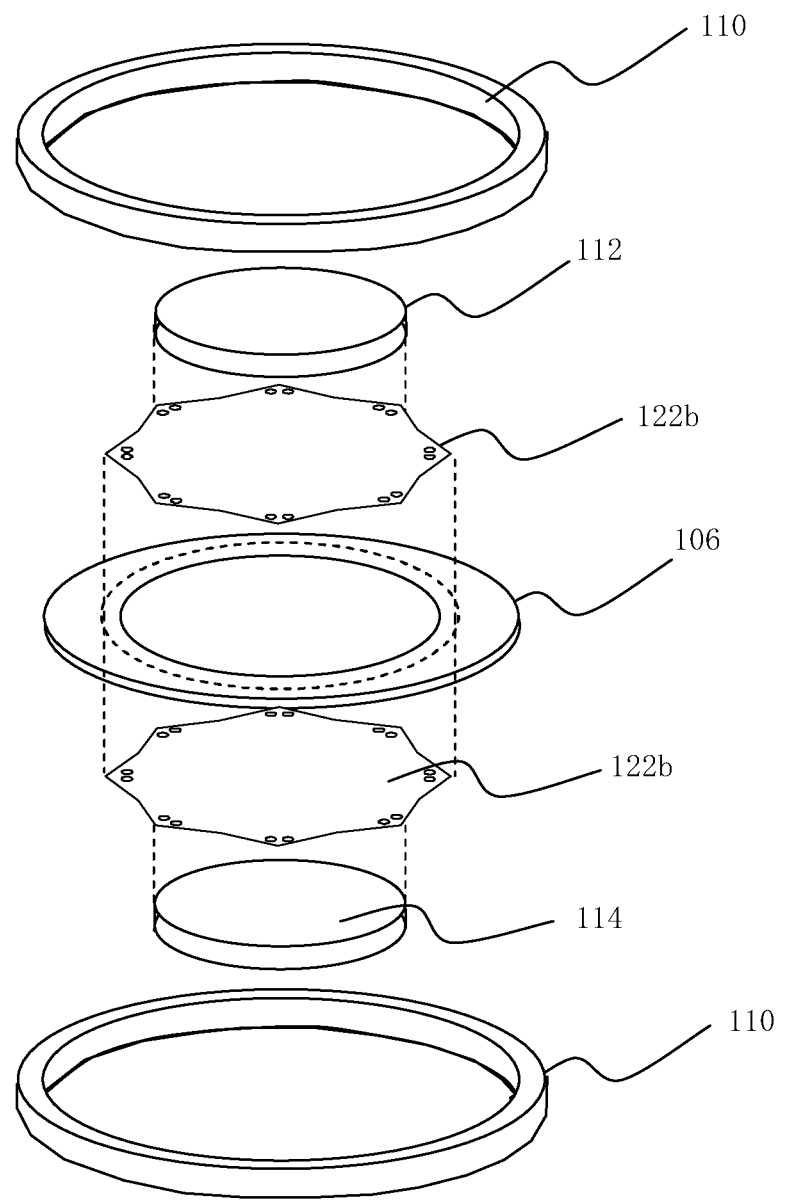
FIG. 29 is a schematic exploded perspective view of a piezoelectric actuator according to an exemplary embodiment 12.

The piezoelectric actuator shown in FIG. 29 was fabricated as an exemplary embodiment 12. In the piezoelectric actuator of an exemplary embodiment 27, the shape of the first pedestal and the second pedestal differs as compared with exemplary embodiment 1. Specifically, the shape of first and second pedestals 122*b* is the same as that of the pedestal shown in FIG. 13. The other configurations are the same as in the first embodiment.

According to the piezoelectric actuator of exemplary embodiment 12, rigidity of outer edge portions of first and second pedestals 122*b* is lowered, and stress concentrates on peripheries of first and second pedestals 122*b*. Therefore, the basic resonance frequency became smaller than in exemplary embodiment 1. Further, a high sound pressure level could be obtained in the low frequency band as compared with exemplary embodiment 1. In addition, flatness of frequency characteristics of the sound pressure level substantially similar to exemplary embodiment 1 can be obtained, and stability with respect to the impact is substantially high similar to exemplary embodiment 1.

Exemplary Embodiment 13

Figure 30:
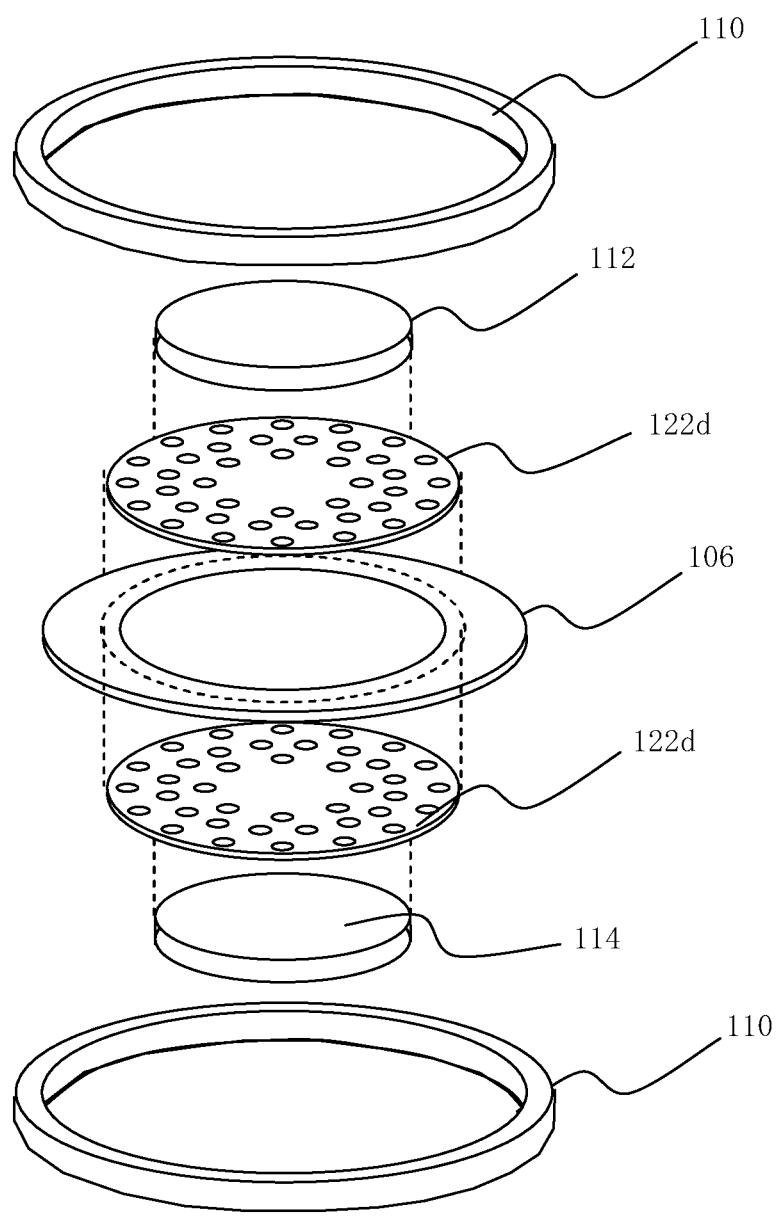
FIG. 30 is a schematic exploded perspective view of a piezoelectric actuator according to an exemplary embodiment 13.

The piezoelectric actuator shown in FIG. 30 was fabricated as an exemplary embodiment 13. In the piezoelectric actuator of the exemplary embodiment 13, the first pedestal and the second pedestal differ as compared with exemplary embodiment 1. Specifically, the shape of first and second pedestals 122*d* is the same as that of the pedestal shown in FIG. 15. The other configurations are the same as in the exemplary embodiment 1.

According to the piezoelectric actuator of the exemplary embodiment 13, a plurality of openings 1301 are formed in first and second pedestals 122*d*, and thereby rigidity of first and second pedestals 122*d* is lowered. Therefore, the resonance frequency became lower than in the exemplary embodiment 1, and a high sound pressure level could be obtained in the low frequency band. In addition, frequency dependence of the sound pressure level was substantially flattened similar to exemplary embodiment 1, and stability with respect to the impact became high.

Exemplary Embodiment 14

Figure 31:
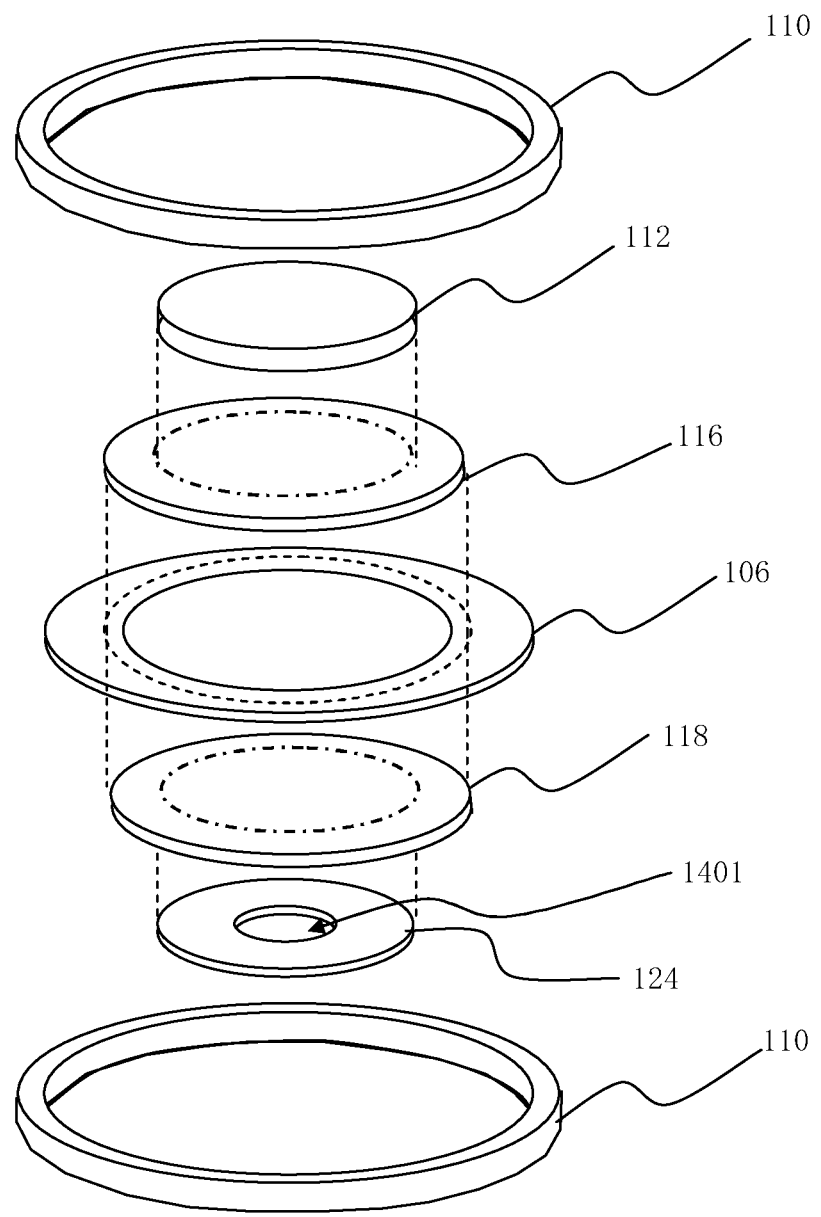
FIG. 31 is a schematic exploded perspective view of a piezoelectric actuator according to an exemplary embodiment 14.

The piezoelectric actuator shown in FIG. 31 was fabricated as an exemplary embodiment 14. In the piezoelectric actuator of the exemplary embodiment 14, second piezoelectric vibrator 124 is the same as the piezoelectric vibrator shown in FIG. 16. Opening 1401 is formed in second piezoelectric vibrator 124. Specifically, the diameter of second piezoelectric element 124 is 17 millimeters, and the diameter of opening 1401 is 4 millimeters. The thickness of the piezoelectric body included in second piezoelectric element 124 is 40 μm. The other configurations are the same as in the exemplary embodiment 1.

In the piezoelectric actuator of the exemplary embodiment 14, a high sound pressure level could be obtained in the low frequency band as compared with exemplary embodiment 1. In addition, a substantial flatness of frequency characteristics of the sound pressure level could be obtained similar to exemplary embodiment 1. This is because rigidity of second piezoelectric element 124 was lowered and the resonance frequency was lowered. Further, stability with respect to the impact is high similar to exemplary embodiment 1.

Exemplary Embodiment 15

Figure 32:
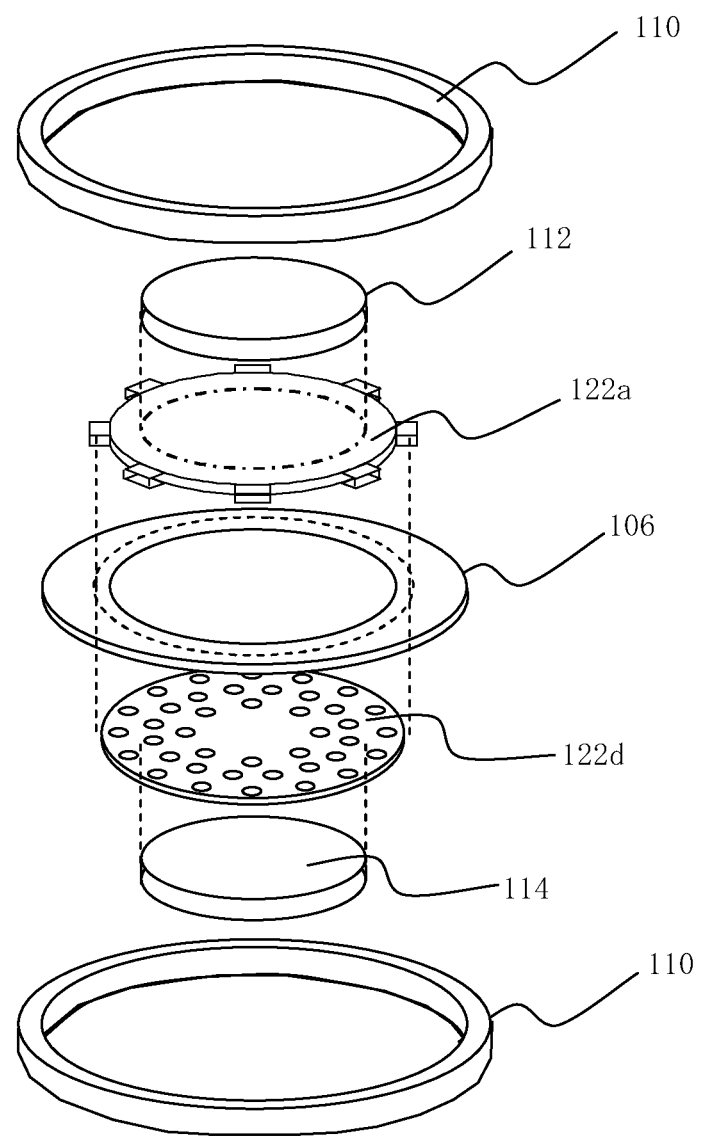
FIG. 32 is a schematic exploded perspective view of a piezoelectric actuator according to an exemplary embodiment 15.

As shown in FIG. 32, in the piezoelectric actuator of the exemplary embodiment 15, the first pedestal and the second pedestal differ as compared with exemplary embodiment 1. Specifically, first pedestal 122*a* is the same as the pedestal shown in FIG. 12, and second pedestal 122*d* is the same as the pedestal shown in FIG. 15.

According to the piezoelectric actuator of the exemplary embodiment 15, the resonance frequency becomes smaller than in exemplary embodiment 1, and the sound pressure level in the low frequency band becomes high. It is considered that this is because of the lowering of the rigidity and stress concentration on the outer edge portion of first pedestal 122*a*, and because of the lowering of the rigidity and stress concentration on the outer edge portion of second pedestal 122*d*. Further, two different pedestals 122*a* and 122*d* are used, and thereby two piezoelectric vibrators have frequency characteristics different from each other. Therefore, frequency dependence of the sound pressure level was more flattened. In addition, stability with respect to the impact is also high similar to exemplary embodiment 1.

Exemplary Embodiment 16

The shape of the piezoelectric actuator of the exemplary embodiment 16 is the same as the shape of the piezoelectric actuator of exemplary embodiment 1 (Refer to FIG. 3). However, vibrating membrane 106 is comprised of phosphor bronze, which is a metal material, instead of polyethylene terephthalate (PET). Vibrating membrane 106 has opening 108 in the center thereof. The diameter of vibrating membrane 106 is 21 millimeters, the diameter of opening 108 of the vibrating membrane is 17 millimeters, and the thickness of vibrating membrane 106 is 20 μm. The other configurations are the same as in the first embodiment.

According to the piezoelectric actuator of exemplary embodiment 16, the resonance frequency became lower than in exemplary embodiment 1, and thereby a high sound pressure level could be obtained in the low frequency band. In addition, substantial flatness of frequency characteristics of the sound pressure level similar to exemplary embodiment 1 and stability with respect to the impact could be obtained.

Exemplary Embodiment 17

Figure 33:
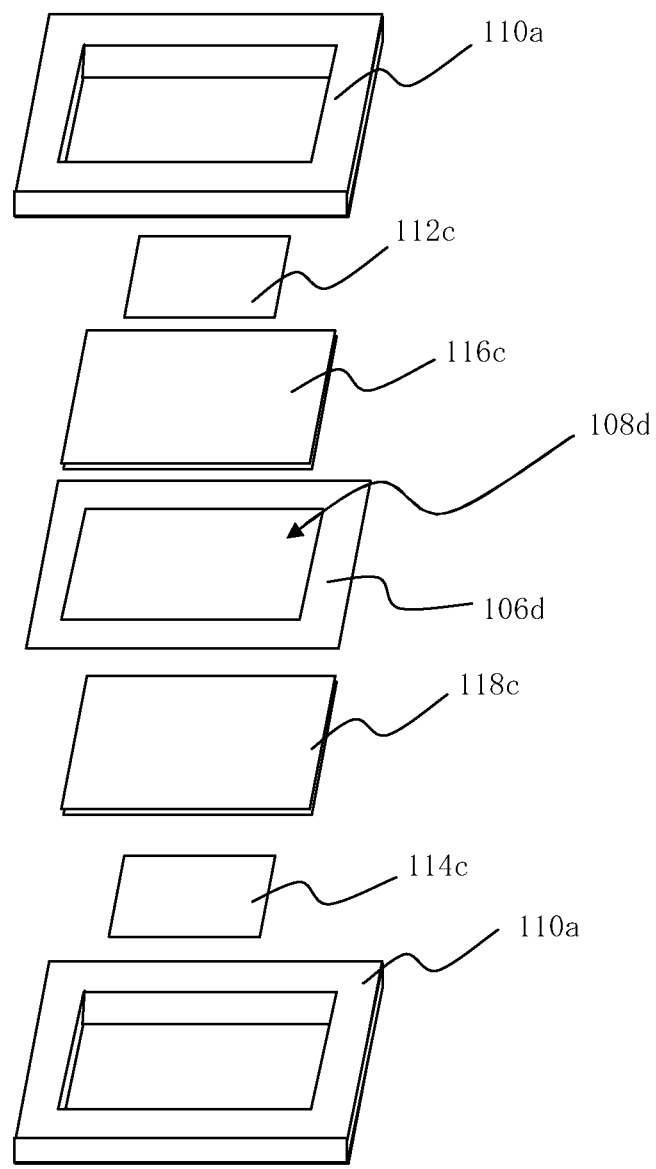
FIG. 33 is a schematic exploded perspective view of a piezoelectric actuator according to an exemplary embodiment 17.

The piezoelectric actuator shown in FIG. 33 was fabricated as exemplary embodiment 17. In the piezoelectric actuator of exemplary embodiment 31, the shapes of first and second piezoelectric elements 112c and 114c, first and second pedestals 116c and 118c, vibrating membrane 106d, and support body 110a are squares.

The thicknesses of first and second piezoelectric elements 112c and 114c, first and second pedestals 116c and 118c, vibrating membrane 106d, and support body 110a are the same as the thicknesses of the first and second piezoelectric elements, the first and second pedestals, the vibrating membrane, and the support body in exemplary embodiment 1, respectively.

In addition, the shape of first and second piezoelectric elements 112c and 114c is a square whose one side is 18 millimeters. The shape of first and second pedestals 116c and 118c is a square whose one side is 19 millimeters. Vibrating membrane 106d has square opening 108d in the center thereof. The length of one side of vibrating membrane 106d is 21 millimeters, and the length of one side of opening 108d of vibrating membrane 106d is 17 millimeters. Support body 110a has a square frame shape, one side of the outer edge thereof is 21 millimeters, and one side of the inner edge thereof is 20 millimeters.

According to the piezoelectric actuator of exemplary embodiment 17, the resonance frequency became lower than in exemplary embodiment 1, and thereby a high sound pressure level could be obtained in the low frequency band. Further, frequency dependence of the sound pressure level is flattened due to complex vibration frequency characteristics belonging to the square piezoelectric vibrator. In addition, stability with respect to the impact is high similar to exemplary embodiment 1.

Exemplary Embodiment 18

Figure 11:
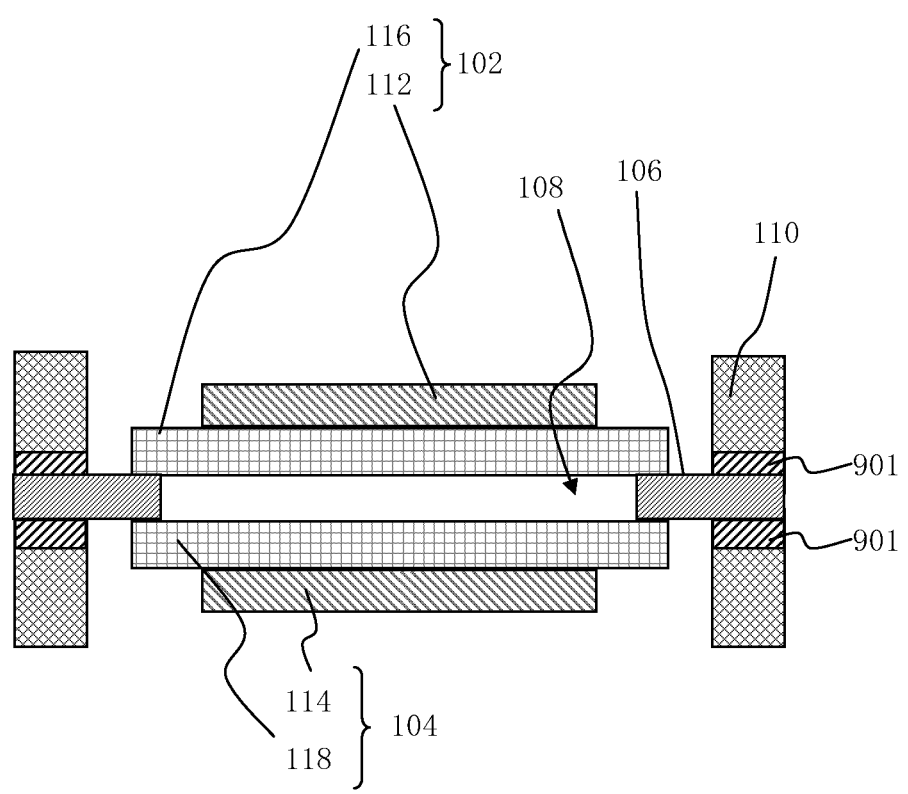
FIG. 11 is a schematic cross-sectional view according to still another modified example of the piezoelectric actuator.

The above-mentioned piezoelectric actuator shown in FIG. 11 was fabricated as exemplary embodiment 18. In the piezoelectric actuator of the exemplary embodiment 18, low rigidity member 901 is integrally sandwiched between vibrating membrane 106 and support body 110. Rigidity of low rigidity member 901 is smaller than the rigidity of vibrating membrane 106. Vibrating membrane 106 is substantially circular, and has opening 108 in the center thereof.

Low rigidity member 901 is comprised of silicon rubber. Low rigidity member 901 has a circular frame shape, the outer diameter of low rigidity member 901 is 21 millimeters, the inner diameter of low rigidity member 901 is 20 millimeters, and the thickness of low rigidity member 901 is 70 μm. The other configurations are the same as in the first embodiment.

According to the piezoelectric actuator of the exemplary embodiment 18, the resonance frequency becomes lower than in exemplary embodiment 1 due to low rigidity member 901, and the sound pressure level in the low frequency band is improved. Further, frequency characteristics of the sound pressure level are substantially flattened similar to exemplary embodiment 1, and stability with respect to the impact is improved.

This application claims priority based on Japanese Patent Application No. 2009-114575 filed on May 11, 2009, the disclosure of which is incorporated by reference herein in its entirety.

As described above, although the exemplary embodiments have been proposed and described in detail, it is to be understood that the present invention is not limited to the above-described exemplary embodiments, but various changes and modifications can be made without departing from the scope of the invention.

| Reference Signs List | |
|---|---|
| 100 | Piezoelectric Actuator |
| 102 | First Piezoelectric Vibrator |
| 104 | Second Piezoelectric Vibrator |
| 106, 106a, 106b, 106c, and 106d | Vibrating Membrane |
| 108 and 108d | Opening of Vibrating Membrane |
| 110 and 110a | Support Body |
| 112 and 112c | First Piezoelectric Element |
| 114, 114a, 114b, and 114c | Second Piezoelectric Element |
| 116 and 116c | First Pedestal |
| 118, 118a, 118b, and 118c | Second Pedestal |
| 122a, 122b, 112c, and 112d | Pedestal |
| 124 | Piezoelectric Element |
| 130 | Piezoelectric Body |
| 132 | Electrode Layer |
| 136 | Power Supply |
| 502 | First Power Supply |
| 504 | Second Power Supply |
| 506 | Control Means |
| 601 | Stepped Portion |
| 801 | First Membrane Portion |
| 802 | Second Membrane Portion |
| 901 | Low Rigidity Member |
| 1001 | Projecting Portion |
| 1101, 1201, and 1301 | Opening of Pedestal |
| 1401 | Opening of Piezoelectric Element |

The invention claimed is:

1. A piezoelectric actuator comprising:
a first piezoelectric vibrator including a first pedestal and a first piezoelectric element connected to the first pedestal;
a second piezoelectric vibrator including a second pedestal and a second piezoelectric element connected to the second pedestal; and
a vibrating membrane having an opening, wherein
said first piezoelectric vibrator is connected to one surface of said vibrating membrane straddling the opening of said vibrating membrane, and
said second piezoelectric vibrator is connected to another surface of said vibrating membrane straddling the opening of said vibrating membrane.

2. The piezoelectric actuator according to claim 1, wherein rigidity of said vibrating membrane is smaller than rigidity of said pedestal.

3. The piezoelectric actuator according to claim 1, further comprising a support body that supports an outer edge portion of said vibrating membrane.

4. The piezoelectric actuator according to claim 1, wherein
the one surface of said vibrating membrane is connected to a surface of said first pedestal to which said first piezoelectric element is not connected, and
the other surface of said vibrating membrane is connected to a surface of said second pedestal to which said second piezoelectric element is not connected.

5. The piezoelectric actuator according to claim 4, wherein at least one of said first pedestal and said second pedestal is plate-shaped, and a periphery of the plate-shaped pedestal and a vicinity of the opening of said vibrating membrane are connected to each other.

6. The piezoelectric actuator according to claim 1, further comprising a driving device that independently drives said first piezoelectric element and said second piezoelectric element.

7. The piezoelectric actuator according to claim 1, wherein said first piezoelectric vibrator and said second piezoelectric vibrator have the same resonance frequency as each other.

8. The piezoelectric actuator according to claim 1, wherein said first piezoelectric vibrator and said second piezoelectric vibrator have resonance frequencies different from each other.

9. The piezoelectric actuator according to claim 3, wherein rigidity of a portion of said vibrating membrane supported by said support body is smaller than rigidity of the vicinity of the opening of said vibrating membrane.

10. The piezoelectric actuator according to claim 3, wherein said support body sandwiches the outer edge portion of said vibrating membrane through a low rigidity member having smaller rigidity than said vibrating membrane.

11. The piezoelectric actuator according to claim 1, wherein at least one of said first piezoelectric element and said second piezoelectric element has an opening.

12. The piezoelectric actuator according to claim 1, wherein at least one of said first pedestal and said second pedestal has an opening.

13. The piezoelectric actuator according to claim 1, wherein at least one of said first pedestal and said second pedestal is plate-shaped, a projecting portion protruding in a direction from a center of said pedestal toward an outside is formed in the periphery of the plate-shaped pedestal, the plate-shaped pedestal straddles the opening of said vibrating membrane, and the projecting portion is connected to said vibrating membrane.

14. The piezoelectric actuator according to claim 1, wherein at least one of said first pedestal and said second pedestal is plate-shaped, and the plate-shaped pedestal has a petal shape.

15. The piezoelectric actuator according to claim 1, wherein said first piezoelectric vibrator and said second piezoelectric vibrator vibrate in a direction perpendicular to a membrane surface of said vibrating membrane.

16. An audio component comprising the piezoelectric actuator according to claim 1, and emitting sound by bending vibration of the piezoelectric actuator.

17. The audio component according to claim 16, emitting sound by vibrations of said vibrating membrane that comprises said piezoelectric actuator.

* * * * *

UNITED STATES PATENT AND TRADEMARK OFFICE
CERTIFICATE OF CORRECTION

PATENT NO.        : 8,569,930 B2
APPLICATION NO.   : 13/319872
DATED             : October 29, 2013
INVENTOR(S)       : Takahashi et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 164 days.

Signed and Sealed this
Twenty-second Day of September, 2015

Michelle K. Lee
*Director of the United States Patent and Trademark Office*